(12) United States Patent
Terai

(10) Patent No.: US 10,811,462 B2
(45) Date of Patent: Oct. 20, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventor: Masayuki Terai, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 15/188,018

(22) Filed: Jun. 21, 2016

(65) Prior Publication Data

US 2017/0117327 A1  Apr. 27, 2017

(30) Foreign Application Priority Data

Oct. 27, 2015  (KR) .................. 10-2015-0149200

(51) Int. Cl.
*H01L 27/24* (2006.01)
*H01L 45/00* (2006.01)
*H01L 23/522* (2006.01)

(52) U.S. Cl.
CPC ...... *H01L 27/2481* (2013.01); *H01L 23/5221* (2013.01); *H01L 27/2427* (2013.01); *H01L 45/16* (2013.01); *H01L 45/06* (2013.01); *H01L 45/126* (2013.01); *H01L 45/1233* (2013.01); *H01L 45/1675* (2013.01); *H01L 45/1683* (2013.01)

(58) Field of Classification Search
CPC . H01L 45/06; H01L 27/2427; H01L 27/2481; H01L 45/1233; H01L 23/5221; H01L 45/1246; H01L 27/2463
See application file for complete search history.

(56) References Cited

U.S. PATENT DOCUMENTS

| | | |
|---|---|---|
| 7,531,378 B2 | 5/2009 | Peters |
| 7,589,343 B2 | 9/2009 | Lowrey |
| 7,638,789 B2 | 12/2009 | Peters |
| 7,646,630 B2 | 1/2010 | Lowrey et al. |
| 7,671,395 B2 | 3/2010 | Park et al. |
| 7,910,904 B2 | 3/2011 | Kuo et al. |
| 8,187,946 B2 | 5/2012 | Karpov et al. |
| 8,237,143 B2 | 8/2012 | Toda |
| 8,373,151 B2 | 2/2013 | Parkinson |
| 8,404,514 B2 | 3/2013 | Lee et al. |
| 8,440,535 B2 | 5/2013 | Dennison |
| 8,486,743 B2 | 7/2013 | Bresolin et al. |
| 8,530,875 B1 | 9/2013 | Chang et al. |

(Continued)

*Primary Examiner* — John A Bodnar
(74) *Attorney, Agent, or Firm* — Volentine, Whitt & Francos, PLLC

(57) ABSTRACT

A semiconductor device includes a first word line and a second word line extending abreast of each other in a first direction. A bit line extends between the first word line and the second word line in a second direction intersecting the first direction. A lower electrode is formed on one surface of the first word line. An ovonic threshold switch (OTS) is formed on the lower electrode. An intermediate electrode is formed on the OTS. A phase change memory (PCM) is formed on the intermediate electrode, and an upper electrode is formed between the first PCM and a surface of the bit line. The width of the first upper electrode in the second direction is narrower than the width of the first intermediate electrode in the second direction.

16 Claims, 22 Drawing Sheets

(56) References Cited

U.S. PATENT DOCUMENTS

| | | | |
|---|---|---|---|
| 8,637,342 B2 | 1/2014 | Karpov et al. | |
| 8,841,644 B2 | 9/2014 | Karpov et al. | |
| 8,952,299 B2 | 2/2015 | Kim et al. | |
| 9,006,073 B2 | 4/2015 | Chae et al. | |
| 2003/0209746 A1* | 11/2003 | Horii | H01L 29/685 257/295 |
| 2004/0113137 A1* | 6/2004 | Lowrey | H01L 27/2427 257/5 |
| 2006/0097240 A1 | 5/2006 | Lowrey et al. | |
| 2006/0097341 A1 | 5/2006 | Pellizzer et al. | |
| 2006/0257787 A1 | 11/2006 | Kuo et al. | |
| 2007/0105267 A1 | 5/2007 | Karpov et al. | |
| 2008/0116443 A1* | 5/2008 | Chang | H01L 27/2436 257/4 |
| 2008/0224116 A1* | 9/2008 | Peters | H01L 27/2427 257/3 |
| 2009/0184308 A1 | 7/2009 | Peters | |
| 2009/0196091 A1 | 8/2009 | Kau et al. | |
| 2010/0105193 A1* | 4/2010 | Lee | G11C 13/0004 438/478 |
| 2011/0070715 A1 | 3/2011 | Karpov et al. | |
| 2011/0128779 A1* | 6/2011 | Redaelli | G11C 13/00 365/163 |
| 2011/0147695 A1* | 6/2011 | Lee | H01L 27/2427 257/4 |
| 2012/0002461 A1 | 1/2012 | Karpov et al. | |
| 2012/0220099 A1 | 8/2012 | Dennison | |
| 2012/0241705 A1 | 9/2012 | Bresolin et al. | |
| 2013/0094273 A1* | 4/2013 | Chien | G11C 5/06 365/63 |
| 2013/0200322 A1 | 8/2013 | Somaschini et al. | |
| 2013/0306929 A1 | 11/2013 | Lee et al. | |
| 2014/0008602 A1 | 1/2014 | Karpov et al. | |
| 2014/0038379 A1 | 2/2014 | Kim et al. | |
| 2014/0098594 A1* | 4/2014 | Azuma | H01L 27/2418 365/148 |
| 2014/0138604 A1* | 5/2014 | Liu | H01L 45/06 257/4 |
| 2014/0177329 A1 | 6/2014 | Jun | |
| 2014/0217349 A1 | 8/2014 | Hopkins | |
| 2014/0291604 A1 | 10/2014 | Pellizzer et al. | |
| 2015/0028280 A1 | 1/2015 | Sciarrillo et al. | |
| 2015/0084156 A1 | 3/2015 | Ravasio et al. | |
| 2015/0188050 A1 | 7/2015 | Kim et al. | |
| 2016/0276022 A1* | 9/2016 | Redaelli | G11C 13/0004 |

\* cited by examiner

SEMICONDUCTOR DEVICE AND METHOD FOR FABRICATING THE SAME

CROSS-REFERENCE TO RELATED APPLICATION

This application claims priority, and all the benefits accruing therefrom under 35 U.S.C. 119, from Korean Patent Application No. 10-2015-0149200 filed on Oct. 27, 2015, in the Korean Intellectual Property Office, the contents of which in its entirety are herein incorporated by reference.

BACKGROUND

1. Technical Field

The present disclosure relates to a semiconductor device and a method for fabricating the same.

2. Description of the Related Art

Generally, a semiconductor memory device is categorized into a volatile memory device of which stored information is lost upon interruption of power supply, and a nonvolatile memory device of which stored information can be continuously retained even with the interruption of power supply. For the nonvolatile memory device, a flash memory device having a stacked gate structure is mainly adopted. Meanwhile, a phase change memory device has been recently suggested as a new nonvolatile memory device that will replace the flash memory device.

SUMMARY

A technical object of the present disclosure is to provide a semiconductor device having enhanced integration density and enhanced thermal efficiency.

Another technical object of the present disclosure is to provide a method for fabricating a semiconductor device having enhanced integration density and enhanced thermal efficiency.

The objectives that are intended to be addressed by the present disclosure are not limited to that mentioned above, and other objectives that are not mentioned above can be clearly understood to those skilled in the art based on the description provided below.

According to an aspect of the present disclosure, there is provided a semiconductor device having a first word line and a second word line extending abreast of each other in a first direction, a bit line extending between the first word line and the second word line in a second direction intersecting the first direction, a first lower electrode formed on one surface of the first word line, a first ovonic threshold switch (OTS) formed on the first lower electrode, a first intermediate electrode formed on the first OTS, a first phase change memory (PCM) formed on the first intermediate electrode, a first upper electrode formed between the first PCM and a surface of the bit line. The width of the first upper electrode in the second direction is narrower than the width of the first intermediate electrode in the second direction. A second lower electrode is formed on one surface of the bit line, a second OTS is formed on the second lower electrode, a second intermediate electrode is formed on the second OTS, a second PCM is formed on the second intermediate electrode, and a second upper electrode is formed between the second PCM and the second word line. The width of the first upper electrode in the first direction is narrower than the width of the second intermediate electrode in the first direction.

According to another aspect of the present disclosure, there is provided a semiconductor device having a bit line and a first cell formed under the bit line. The first cell includes a first ovonic threshold switch (OTS), a first phase change memory (PCM), a first intermediate electrode formed between the first OTS and the first PCM, and a first upper electrode formed between the first PCM and the bit line. The area of contact between the first upper electrode and the first PCM is narrower than the area of contact between the first intermediate electrode and the first PCM. A second cell is formed on the bit line and includes a second OTS, a second PCM, a second intermediate electrode formed between the second OTS and the second PCM, and a second upper electrode formed on the second PCM. The area of contact between the second upper electrode and the second PCM is smaller than the area of contact between the second intermediate electrode and the second PCM.

According to still another aspect of the present disclosure, there is provided a semiconductor device having a first word line and a second word line extending in a first direction and being partially overlapped with each other, a bit line extending between the first word line and the second word line in a second direction intersecting the first direction, and a first cell and a second cell formed in a region where the bit line and the first word line and the second word line are overlapped, to be connected with opposing surface of the bit line, respectively. The first cell includes a first ovonic threshold switch (OTS), a first phase change memory (PCM), a first intermediate electrode formed between the first OTS and the first PCM, a first upper electrode formed on the first PCM, and a first spacer positioned on a side surface of the first upper electrode. The second cell includes a second OTS, a second PCM, a second intermediate electrode formed between the second OTS and the second PCM, a second upper electrode formed on the second PCM, and a second spacer positioned on a side surface of the second upper electrode. The first spacer extends in the first direction and the second spacer extends in the second direction.

According to an aspect of the present disclosure, there is provided a method for fabricating a semiconductor device. The method includes forming a first word line and a first cell on the first word line. The first cell includes a first ovonic threshold switch (OTS), a first phase change memory (PCM), a first intermediate electrode formed between the first OTS and the first PCM, a first upper electrode formed on the first PCM, and a first spacer positioned on a side surface of the first upper electrode. A bit line is formed on the first cell, and a second cell is formed on the bit line. The second cell includes a second OTS, a second PCM, a second intermediate electrode formed between the second OTS and the second PCM, a second upper electrode formed on the second PCM, and a second spacer positioned on a side surface of the second upper electrode and forming a second word line on the second cell.

According to an aspect of the present disclosure, there is provided a semiconductor device including a phase change memory (PCM) cell, an address signal line that addresses the PCM cell; and an electrode that electrically connects the address signal line to the PCM cell. The cross-sectional area of the electrode decreases along its length from where the electrode connects with the address signal line to where the electrode connects with the PCM cell.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
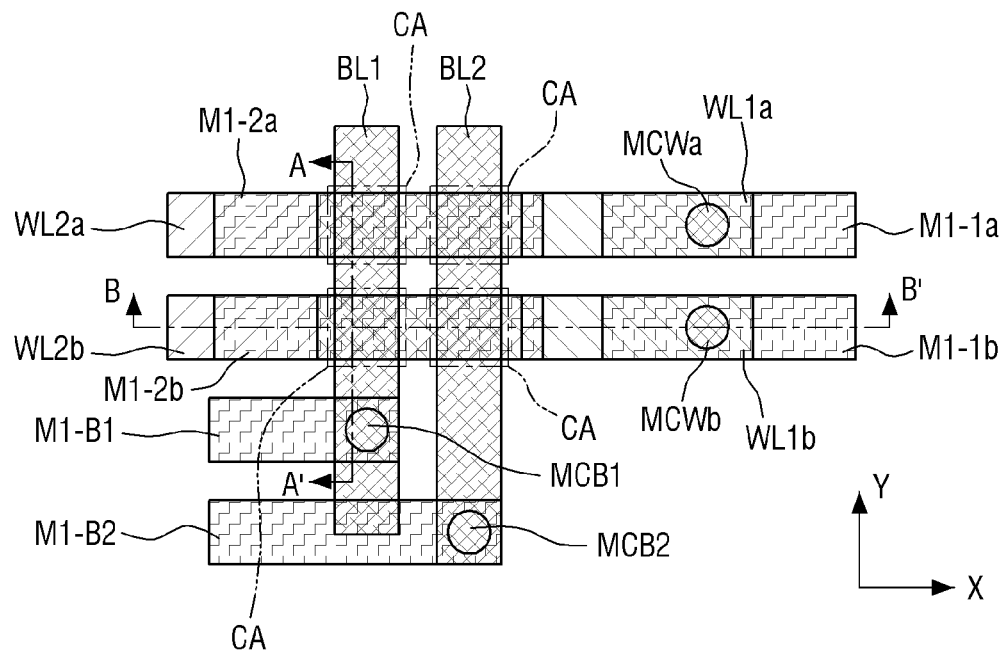
FIG. 1 is a layout diagram provided to explain a semiconductor device according to some exemplary embodiments.

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this disclosure belongs. It is noted that the use of any and all examples or exemplary terms provided herein is intended merely to better illuminate the disclosure and is not a limitation on the scope of the disclosure unless otherwise specified. Further, unless defined otherwise, all terms defined in generally used dictionaries may not be overly interpreted.

Hereinbelow, a semiconductor device according to an exemplary embodiment will be explained with reference to FIGS. 1 to 3A and 4.

Figure 2:
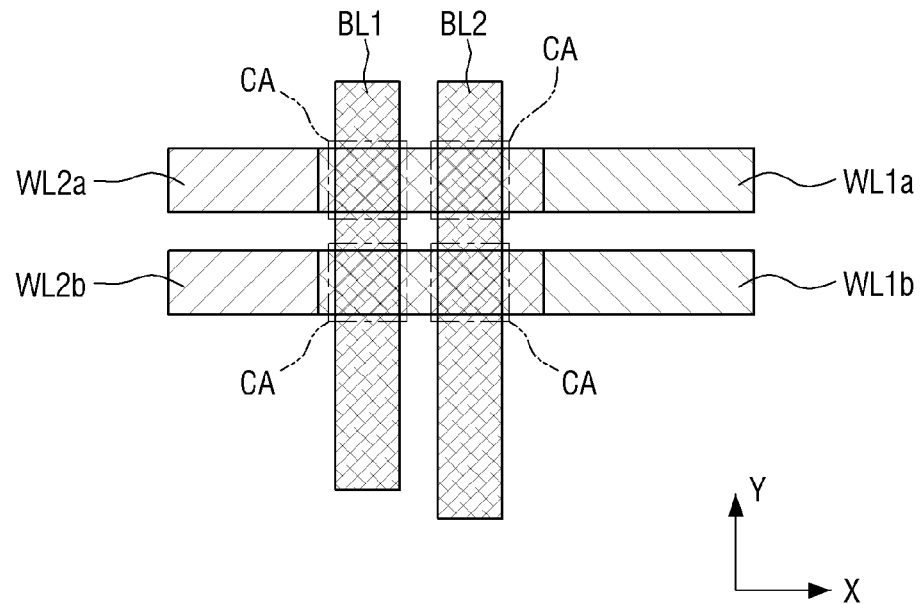
FIG. 2 is a layout diagram omitting the wire pattern and contacts illustrated by FIG. 1.
Figure 3A:
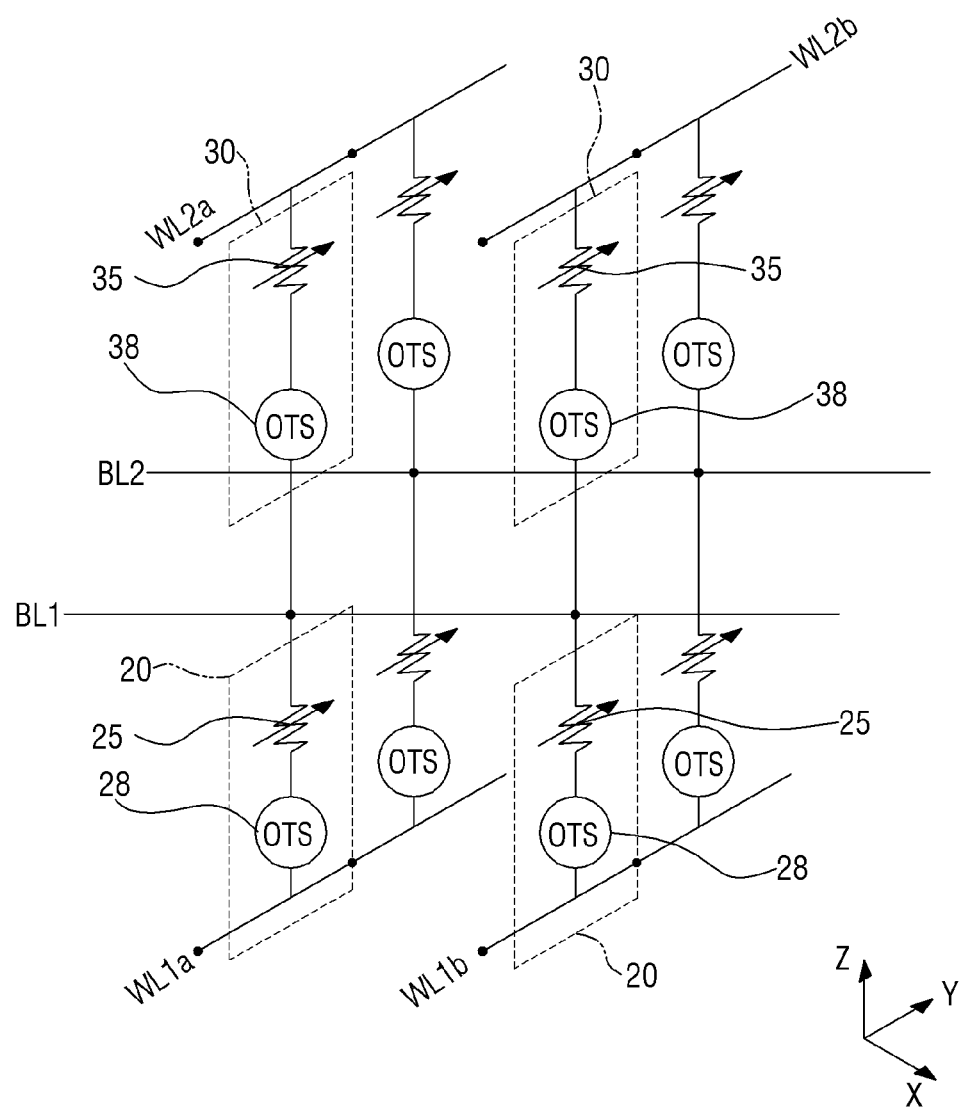
FIG. 3A is a circuit diagram provided to explain the semiconductor device of FIG. 1.
Figure 4:
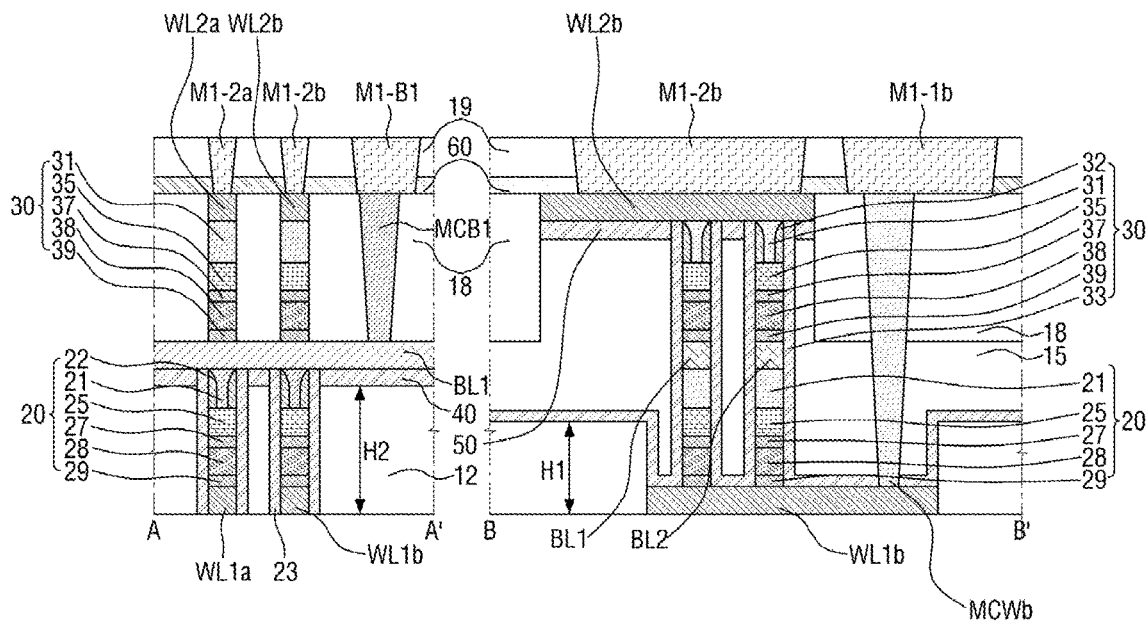
FIG. 4 illustrates cross sectional views taken on lines A-A' and B-B' of FIG. 1.

FIG. 1 is a layout diagram provided to explain a semiconductor device according to some exemplary embodiments, and FIG. 2 is a layout diagram omitting the wire pattern and contacts of FIG. 1. FIG. 3A is a circuit diagram provided to explain the semiconductor device of FIG. 1. FIG. 4 is a cross sectional view taken on lines A-A' and B-B' of FIG. 1. For convenience of explanation, FIG. 2 skips illustration of the wire patterns M1-1a, M1-2a, M1-1b, M1-2b, M1-B1, M1-B2 and contacts MCWa, MCWb, MCB1, MCB2.

Referring to FIGS. 1 to 3A and 4, a semiconductor device according to some exemplary embodiments may include first word lines WL1a, WL1b, second word lines WL2a, WL2b, bit lines BL1, BL2, wire patterns M1-1a, M1-2a, M1-1b, M1-2b, M1-B1, M1-B2, and contacts MCWa, MCWb, MCB1, MCB2.

The first word lines WL1a, WL1b may extend in a first direction X. There may be a plurality of first word lines WL1a, WL1b. Accordingly, a plurality of first word lines WL1a, WL1b may be spaced apart from one another in a second direction Y. The second direction Y and the first direction X may be different directions from each other. The second direction Y may be the direction of intersecting the first direction X, or the second direction Y and the first direction X may be orthogonal to each other. However, exemplary embodiments are not limited to the example given above.

A plurality of first word lines WL1a, WL1b may be formed at a same height. That is, the heights of the upper surfaces of a plurality of first word lines WL1a, WL1b may be the same as one another. A plurality of first word lines WL1a, WL1b may extend abreast of one another in the first direction X. The first word lines WL1a, WL1b having a rectangular shape may have a long side which is relatively longer, and a short side which is relatively shorter. The expression "the first word lines WL1a, WL1b extend(ing) in the first direction X" as used herein refers to a meaning that the direction in which the long sides of the first word lines WL1a, WL1b extend is the first direction X. Although the first word lines WL1a, WL1b are illustrated in the drawings in a rectangular shape, the exemplary embodiments are not limited herein.

The second word lines WL2a, WL2b may extend in a first direction X. There may be a plurality of second word lines WL2a, WL2b. Accordingly, a plurality of second word lines WL2a, WL2b may be spaced apart from one another in a second direction Y.

A plurality of second word lines WL2a, WL2b may be formed at a same height. That is, the heights of the upper surfaces of a plurality of second word lines WL2a, WL2b may be the same as one another. A plurality of second word lines WL2a, WL2b may extend abreast of one another in the first direction X. The second word lines WL2a, WL2b having a rectangular shape may have a long side which is relatively longer, and a short side which is relatively shorter. The expression "the second word lines WL2a, WL2b extend (ing) in the first direction X" as used herein refers to a meaning that the direction in which the long sides of the second word lines WL2a, WL2b extend is the second direction Y. However, although the second word lines WL2a, WL2b are illustrated in the drawings in a rectangular shape, the exemplary embodiments are not limited herein.

The first word lines WL1a, WL1b and the second word lines WL2a, WL2b may be spaced apart from each other in a different direction from the first direction X and the second direction Y. For example, the different direction may be a perpendicular direction, but not limited thereto. Accordingly, it is assumed herein only for convenience of explanation that the different direction is a perpendicular direction.

The second word lines WL2a, WL2b may be positioned higher than the first word lines WL1a, WL1b. That is, while the second word lines WL2a, WL2b extend abreast in the same direction as the first word lines WL1a, WL1b, these may be formed at different heights and do not meet with one another.

The second word lines WL2a, WL2b may be overlapped with the first word lines WL1a, WL1b in a perpendicular direction. At intersect regions CA where the bit lines BL1, BL2, and the first word lines WL1a, WL1b and the second word lines WL2a, WL2b are overlapped, memory elements, i.e., a first cell 20 and a second cell 30 may be formed in a perpendicular direction. The first word lines WL1a, WL1b may include an overlap region where the second word lines WL2a, WL2b are overlapped therewith, and a non-overlap region where the second word lines WL2a, WL2b are not overlapped. The overlap region may be connected with the first cell 20, and the non-overlap region may be connected with word line contacts MCWa, MCWb.

The bit lines BL1, BL2 may be positioned between the first word lines WL1a, WL1b and the second word lines WL2a, WL2b. The bit lines BL1, BL2 may be positioned at heights between the heights of the first word lines WL1a, WL1b and the second word lines WL2a, WL2b. The bit lines BL1, BL2 may extend in a second direction. Accordingly, as illustrated in FIGS. 1 and 2, the first word lines WL1a, WL1b and the second word lines WL2a, WL2b, and the bit lines BL1, BL2 may construct a mesh structure or a lattice structure. The bit lines BL1, BL2 may not directly contact the first word lines WL1a, WL1b and the second word lines WL2a, WL2b. In some exemplary embodiments, the first word lines WL1a, WL1b and the second word lines WL2a, WL2b, and the bit lines BL1, BL2 may extend in an orthogonal direction to each other.

There may be a plurality of bit lines BL1, BL2. Accordingly, a plurality of bit lines BL1, BL2 may be spaced apart from one another in a first direction X. A memory device, i.e., the first cell 20 may be formed between a plurality of bit lines BL1, BL2 and a plurality of first word lines WL1a, WL1b. Further, a memory device, i.e., the second cell 30 may be formed between a plurality of bit lines BL1, BL2 and a plurality of second word lines WL2a, WL2b.

As the first word lines WL1a, WL1b and the second word lines WL2a, WL2b are perpendicularly overlapped with each other, and the bit lines BL1, BL2 extend therebetween so as to be overlapped, the intersect regions CA may be formed, where all of the first word lines WL1a, WL1b, the second word lines WL2a, WL2b and the bit lines BL1, BL2 are overlapped.

The overlap regions CA may include first intersect regions among the first word lines WL1a, WL1b and the bit lines BL1, BL2, and second intersect regions among the second word lines WL2a, WL2b and the bit lines BL1, BL2. The first intersect regions and the second intersect regions may be overlapped perpendicularly to one another. That is, the first intersect regions CA may be formed under the bit lines BL1, BL2, and the second intersect regions CA may be formed on the bit lines BL1, BL2. The first cell 20 may be formed in the first intersect regions CA, and the second cell 30 may be formed in the second intersect regions CA.

Wire patterns M1-1a, M1-2a, M1-1b, M1-2b, M1-B1, M1-B2 may be formed so as to be overlapped on the first word lines WL1a, WL1b, the second word lines WL2a, WL2b, and the bit lines BL1, BL2. Further, the wire patterns M1-1a, M1-2a, M1-1b, M1-2b, M1-B1, M1-B2 may be connected with the first word lines WL1a, WL1b and the bit lines BL1, BL2 electrically and physically through the contacts MCWa, MCWb, MCB1, MCB2.

Specifically, the wire patterns M1-1a, M1-2a, M1-1b, M1-2b, M1-B1, M1-B2 may be formed on the first word lines WL1a, WL1b, the second word lines WL2a, WL2b, and the bit lines BL1, BL2. The wire patterns M1-1a, M1-2a, M1-1b, M1-2b, M1-B1, M1-B2 may be formed so as to be overlapped with the first word lines WL1a, WL1b, the second word lines WL2a, WL2b, and the bit lines BL1, BL2.

Specifically, the first wires M1-1a, M1-1b among the wire patterns M1-1a, M1-2a, M1-1b, M1-2b, M1-B1, M1-B2 may be formed so as to be perpendicularly overlapped with the first word lines WL1a, WL1b. The first wires M1-1a, M1-1b may be perpendicularly overlapped with a portion of the first word lines WL1a, WL1b, but may not be perpendicularly overlapped with the second word lines WL2a, WL2b or the bit lines BL1, BL2. The first wires M1-1a, M1-1b may be connected with the first word lines WL1a, WL1b electrically and physically through the word line contacts MCWa, MCWb. The word line contacts MCWa, MCWb may be perpendicularly formed to connect the first wires M1-1a, M1-1b and the first word lines WL1a, WL1b with each other.

The second wires M1-B1, M1-B2 among the wire patterns M1-1a, M1-2a, M1-1b, M1-2b, M1-B1, M1-B2 may be formed so as to be perpendicularly overlapped with the bit lines BL1, BL2. The second wires M1-B1, M1-B2 may be formed in one-to-one relationship with a plurality of bit lines BL1, BL2. That is, there may be a plurality of second wires M1-B1, M1-B2 formed. As illustrated in FIG. 1, a plurality of second wires M1-B1, M1-B2, along with the third wires M1-2a, M1-2b, may extend in the first direction X and be spaced apart in the second direction Y.

The second wires M1-B1, M1-B2 may be connected with the bit lines BL1, BL2 electrically and physically, through the bit line contacts MCB1, MCB2. The bit line contacts MCB1, MCB2 may be perpendicularly formed in order to connect the second wires M1-B1, M1-B2 and the bit lines BL1, BL2 with each other.

The third wires M1-2a, M1-2b among the wire patterns M1-1a, M1-2a, M1-1b, M1-2b, M1-B1, M1-B2 may be formed so as to be perpendicularly overlapped with the second word lines WL2a, WL2b. The third wires M1-2a, M1-2b may be perpendicularly overlapped with a portion of the second word lines WL2a, WL2b, but may not be perpendicularly overlapped with the first word lines WL1a, WL1b or the bit lines BL1, BL2. The third wires M1-2a, M1-2b may directly contact the second word lines WL2a, WL2b. That is, no other material may be interposed between the third wires M1-2a, M1-2b and the second word lines WL2a, WL2b. However, exemplary embodiments are not limited to the specific examples provided above. Accordingly, these may be connected with insulating films and contacts.

Referring to FIG. 3, with reference to the bit lines BL1, BL2, the first word lines WL1a, WL1b and the second word lines WL2a, WL2b may be positioned symmetrically with each other. The first word lines WL1a, WL1b and the second word lines WL2a, WL2b may extend in the same, first direction X, and the bit lines BL1, BL2 may extend in the second direction.

At this time, the first cell 20 and the second cell 30 may be formed in a third direction Z. The first cell 20 and the second cell 30 may be positioned symmetrically with each other with reference to the bit lines BL1, BL2. The first cell 20 and the second cell 30 may be electrically connected with the first word lines WL1a, WL1b, and the second word lines WL2a, WL2b, respectively.

The first cell 20 may include a first ovonic threshold switch (OTS: 28) and a first phase change memory PCM 25, and the second cell 30 may include a second OTS 38 and a second PCM 35. This will be explained in detail below.

Referring to FIG. 4, a semiconductor device according to some exemplary embodiments may include a nitride film 60, an interlayer insulating film 19, wire patterns M1-2a, M1-1b, M1-2b, M1-B1, and contacts MCWb, MCB1. Further, in a semiconductor device according to some exemplary embodiments, with reference to the bit lines BL1, BL2, the first cell 20 may be formed under, and the second cell 30 may be formed over. The first cell 20 is a stacked structure formed in the third direction Z (i.e., perpendicular direction) between the bit lines BL1, BL2 and the first word lines WL1a, WL1b. The second cell 30 is a stacked structure formed in the third direction Z (i.e., perpendicular direction) between the second word lines WL2a, WL2b and the bit lines BL1, BL2.

Interlayer insulating films 12, 15, 18 may be formed between the first word lines WL1a, WL1b and the second word lines WL2a, WL2b, and the bit lines BL1, BL2. The interlayer insulating films 12, 15, 18 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). The interlayer insulating films 12, 15, 18 may be single layers or stacks of a plurality of layers. The interlayer insulating films 12, 15, 18 may surround the first cell 20 and the second cell 30.

The first cell 20 may include a first lower electrode 29, a first OTS 28, a first intermediate electrode 27, a first PCM 25, a first spacer 22, a first upper electrode 21, a first coating film 23 and a second coating film 33.

The first lower electrode 29 may be formed on the first word lines WL1a, WL1b. The first lower electrode 29 may be one of electrodes that surround the first OTS 28. The first lower electrode 29 may be at least one of Ti, Ta, W, Al, Cr, Zr, Nb, Mo, Hf, B, C or nitrides thereof.

The first OTS 28 may be formed on the first lower electrode 29. The first OTS 28 may include chalcogenide. The first OTS 28 may change the state of the first PCM 25, which will be described below, to any one of on/off states. The first OTS 28 may cause the first PCM 25 to change state thereof according to a voltage applied to the first PCM 25. Accordingly, it may act as a switch of the memory. The first OTS 28 may switch the state of the first PCM 25 according to whether or not the current passing through the first OTS 28 exceeds the threshold current, or whether or not the voltage applied on the first OTS 28 exceeds the threshold voltage.

The first intermediate electrode 27 may be formed on the first OTS 28. The first intermediate electrode 27 may be one of electrodes that surround the first OTS 28. Like the first lower electrode 29, the first intermediate electrode 27 may be at least one of Ti, Ta, W, Al, Cr, Zr, Nb, Mo, Hf, B, C or nitrides thereof.

The first PCM 25 may be formed on the first intermediate electrode 27. The first PCM 25 may include a phase change material. The first PCM 25 may be composed of various types of materials including a compound made of two elements such as GaSb, InSb, InSe, SbTe, GeTe, a compound made of three elements such as GeSbTe, GeBiTe, GaSeTe, InSbTe, $SnSb_2Te_4$, InSbGe, a compound made of four elements such as AgInSbTe, (GeSn)SbTe, GeSb(SeTe), $Te_{81}Ge_{15}Sb_2S_2$, and so on. Further, in order to enhance semiconductor characteristic of the first PCM 25, the materials mentioned above may be doped with nitrogen (N), silicon (Si), carbon (C) or oxygen (O). For example, GeSbTe doped with nitrogen (N), silicon (Si), carbon (C) or oxygen (O) may be included in the first PCM 25.

The first spacer 22 may be formed on the first PCM 25. The first spacer 22 may be formed on a sidewall formed by the interlayer insulating films 12, 15, 18. Specifically, the first spacer 22 may be formed on a sidewall in the second direction Y. Accordingly, while the view taken along A-A' of FIG. 4 shows the first spacer 22, the first spacer 22 may be hidden from view in a view taken along B-B'.

The first spacer 22 may extend in the first direction. Of course, such extending of the first spacer 22 may be limited within the first intersect regions among the intersect regions CA. The first spacer 22 may include silicon nitride or silicon oxide. However, exemplary embodiments are not limited to the example given above.

Since the first spacer 22 is formed in a manner in which it is deposited into a liner shape and then leaves only the sidewall portion, the upper portion may be formed narrower than the lower portion. That is, the width of the first spacer 22 may become narrower in an upward direction.

The first upper electrode 21 may be formed on the first PCM 25. The first upper electrode 21 may be one of electrodes that surround the first PCM 25. Like the first lower electrode 29 and the first intermediate electrode 27, the first upper electrode 21 may be at least one of Ti, Ta, W, Al, Cr, Zr, Nb, Mo, Hf, B, C or nitrides thereof. Alternatively, in some exemplary embodiments, the first upper electrode 21 may include carbon. However, exemplary embodiments are not limited to the example given above.

The first upper electrode 21 may be formed on a side surface of the first spacer 22. That is, the first spacer 22 may be formed on both sides of the first upper electrode 21. Due to the first spacer 22, the volume occupied by the first upper electrode 21 may be relatively decreased. That is, because the first spacer 22 is positioned on the sidewall in the second direction Y, the width of the first upper electrode 21 in the second direction Y may become relatively narrower.

The width of the first upper electrode 21 in the second direction Y may be narrower than the width of the first intermediate electrode 27 in the second direction Y. This is because the width of the first upper electrode 21 in the second direction Y is reduced by the first spacer 22.

The bit lines BL1, BL2 may be formed on the first upper electrode 21, while extending in the second direction Y. The first upper electrode 21 may directly contact the bit lines BL1, BL2. The first upper electrode 21 may be the electrode through which the current flowing from the bit lines BL1, BL2 to the first PCM 25 passes. The first upper electrode 21 may play a role of a heater which causes phase change of the first PCM 25 by applying heat to the first PCM 25.

The area of contact between the first upper electrode 21 and the first PCM 25 may be smaller than the area of contact between the first intermediate electrode 27 and the first PCM 25. Because the first upper electrode 21, the first PCM 25 and the first intermediate electrode 27 are connected in series, the same current passes therethrough. Accordingly, because of a smaller area of contact between the first upper electrode 21 and the first PCM 25, more heat may be generated. Accordingly, as the heater efficiency increases, the phase change efficiency of the first PCM 25 increases.

The width of the first upper electrode 21 may become narrower with decreasing distance to the first PCM 25. This is because the width of the first spacer 22 increases in a downward direction.

The first coating film 23 may be formed between the first cell 20 and the interlayer insulating film 12. Specifically, the first coating film 23 may be formed between the first word lines WL1a, WL1b, the first lower electrode 29, the first OTS 28, the first intermediate electrode 27 and the first PCM 25 and the first spacer 22, and the interlayer insulating film 12.

The first coating film 23 may be formed on the second direction Y side surfaces of the first word lines WL1a, WL1b of the first cell 20. The first coating film 23 may include, for example, silicon nitride, but not limited thereto.

The second coating film 33 may be formed between the first cell 20 and the interlayer insulating film 15. Specifically, the second coating film 33 may be formed between the first word lines WL1a, WL1b, the first lower electrode 29, the first OTS 28, the first intermediate electrode 27, the first PCM 25, the first spacer 22 and the interlayer insulating film 12, and the interlayer insulating film 15.

The second coating film 33 may be formed on the first word lines WL1a, WL1b and the interlayer insulating film 12. The second coating film 33 may be formed on the first direction X side surfaces of the first lower electrode 29, the first OTS 28, the first intermediate electrode 27, the first PCM 25 and the first upper electrode 21. Accordingly, the first coating film 23 and the second coating film 33 may entirely coat the first cell 20. The second coating film 33 may be formed on the first direction X side surfaces of the second cell 30 and the bit lines BL1, BL2.

The bit lines BL1, BL2 may be formed on the first upper electrode 21. The bit lines BL1, BL2 may directly contact the first upper electrode 21. A first barrier film 40 may be formed between the bit lines BL1, BL2 and the interlayer insulating film 12. A height H1 in the third direction of interlayer insulating film 12 in a view taken along B-B' differs from (e.g., is less than) a height H2 in the third direction of interlayer insulating film 12 in a view taken along A-A'.

The first barrier film 40 may expose a portion of the lower surfaces of the bit lines BL1, BL2 so that the first upper electrode 21 and the first coating film 23 contact the bit lines BL1, BL2. The first barrier film 40 may include, for example, silicon nitride, but is not limited thereto.

The second cell 30 may include a second lower electrode 39, a second OTS 38, a second intermediate electrode 37, a second PCM 35, a second spacer 32, a second upper electrode 31, and a second coating film 33.

The second lower electrode 39 may be formed on the bit lines BL1, BL2. The second lower electrode 39 may be one of electrodes that surround the second OTS 38. The second lower electrode 39 may be at least one of Ti, Ta, W, Al, Cr, Zr, Nb, Mo, Hf, B, C or nitrides thereof.

The second OTS 38 may be formed on the second lower electrode 39. The second OTS 38 may include chalcogenide. The second OTS 38 may change the state of the second PCM 35, which will be described below, to any one of on/off states. The second OTS 38 may cause the second PCM 35 to change state thereof according to a voltage applied to the second PCM 35. Accordingly, it may act as a switch of the memory. The second OTS 38 may switch the state of the second PCM 35 according to whether or not the current passing through the second OTS 38 exceeds a threshold current, or whether or not the voltage applied to the second OTS 38 exceeds a threshold voltage.

The second intermediate electrode 37 may be formed on the second OTS 38. The second intermediate electrode 37 may be one of electrodes that surround the second OTS 38. Like the second lower electrode 39, the second intermediate electrode 37 may be at least one of Ti, Ta, W, Al, Cr, Zr, Nb, Mo, Hf, B, C or nitrides thereof.

The second PCM 35 may be formed on the second intermediate electrode 37. The second PCM 35 may include a phase change material. The second PCM 35 may be composed of various types of materials including a compound made of two elements such as GaSb, InSb, InSe, SbTe, GeTe, a compound made of three elements such as GeSbTe, GeBiTe, GaSeTe, InSbTe, SnSb$_2$Te$_4$, InSbGe, a compound made of four elements such as AgInSbTe, (GeSn) SbTe, GeSb(SeTe), Te$_{81}$Ge$_{15}$Sb$_2$S$_2$, and so on. Further, in order to enhance semiconductor characteristic of the second PCM 35, the materials mentioned above may be doped with nitrogen (N), silicon (Si), carbon (C) or oxygen (O). For example, GeSbTe doped with nitrogen (N), silicon (Si), carbon (C) or oxygen (O) may be included in the second PCM 35.

The second spacer 32 may be formed on the second PCM 35. The second spacer 32 may be formed on a sidewall formed by the interlayer insulating films 12, 15, 18. Specifically, the second spacer 32 may be formed on a sidewall in the first direction X. Accordingly, while the second spacer 32 may be hidden from view in the view taken along A-A' of FIG. 4, a view taken along B-B' may show the second spacer 32.

The second spacer 32 may extend in the second direction. Of course, such extending of the second spacer 32 may be limited within the second intersect regions among the intersect regions CA. The second spacer 32 may include silicon nitride or silicon oxide. However, exemplary embodiments are not limited to the example given above.

Since the second spacer 32 is formed in a manner in which it is deposited into a liner shape and then leaves only the sidewall portion, the upper portion may be formed narrower than the lower portion. That is, the width of the second spacer 32 may become narrower in an upward direction.

The second upper electrode 31 may be formed on the second PCM 35. The second upper electrode 31 may be one of electrodes that surround the second PCM 35. Like the second lower electrode 39 and the second intermediate electrode 37, the second upper electrode 31 may be at least one of Ti, Ta, W, Al, Cr, Zr, Nb, Mo, Hf, B, C or nitrides thereof. Alternatively, in some exemplary embodiments, the first upper electrode 21 may include carbon. However, exemplary embodiments are not limited to the example given above.

The second upper electrode 31 may be formed on a side surface of the second spacer 32. That is, the second spacer 32 may be formed on both sides of the second upper electrode 31. Due to the second spacer 32, the volume occupied by the second upper electrode 31 may be relatively decreased. That is, because the second spacer 32 is positioned on the sidewall in the first direction X, the width of the second upper electrode 31 in the first direction X may become relatively narrower.

The width of the second upper electrode 31 in the first direction X may be narrower than the width of the second intermediate electrode 37 in the first direction X. This is because the width of the second upper electrode 31 in the first direction X is reduced by the second spacer 32.

The second word lines WL2a, WL2b may be formed on the second upper electrode 31, while extending in the first direction X. The second upper electrode 31 may directly contact the second word lines WL2a, WL2b. The second upper electrode 31 may be the electrode through which the current flowing from the second word lines WL2a, WL2b to the second PCM 35 passes. The second upper electrode 31 may play a role of a heater which causes a phase change of the second PCM 35 by applying heat to the second PCM 35.

The area of contact between the second upper electrode 31 and the second PCM 35 may be smaller than the area of contact between the second intermediate electrode 37 and the second PCM 35. Because the second upper electrode 31, the second PCM 35 and the second intermediate electrode 37 are connected in series, the same current passes therethrough. Accordingly, because of a smaller area of contact between the second upper electrode 31 and the second PCM 35, more heat may be generated. Accordingly, as the heater efficiency increases, the phase change efficiency of the second PCM 35 increases.

The width of the second upper electrode 31 may become narrower with decreasing distance to the second PCM 35. This is because the width of the second spacer 32 increases in a downward direction.

The second coating film 33 may be formed between the second cell 30 and the interlayer insulating film 15. Specifically, the second coating film 33 may be formed between the bit lines BL1, BL2, the second lower electrode 39, the second OTS 38, the second intermediate electrode 37, the second PCM 35 and the second spacer 32, and the interlayer insulating film 15.

The second coating film 33 may be formed on the first direction X side surfaces of the second lower electrode 39, the second OTS 38, the second intermediate electrode 37, the second PCM 35 and the second spacer 32. The second coating film 33 may be formed on the first direction X side surfaces of the first cell 20 and the bit lines BL1, BL2.

The second word lines WL2a, WL2b may be formed on the second upper electrode 31. The second word lines WL2a, WL2b may directly contact the second upper electrode 31. A second barrier film 50 may be formed between the second word lines WL2a, WL2b and the interlayer insulating film 15.

A nitride film 60 may be formed on the second word lines WL2a, WL2b and the interlayer insulating film 18. The nitride film 60 may be formed for the purpose of isolating elements at a level where the wire patterns M1-1a, M1-2a, M1-1b, M1-2b, M1-B1, M1-B2 are formed. The nitride film 60 may expose the second word lines WL2a, WL2b and the contacts MCWa, MCWb, MCB1, MCB2 connected with the wire patterns M1-1a, M1-2a, M1-1b, M1-2b, M1-B1, M1-B2. The nitride film 60 may include, for example, silicon nitride, but not limited thereto.

The interlayer insulating film 19 may be formed on the nitride film 60. The interlayer insulating film 19 may include therein the wire patterns M1-1a, M1-2a, M1-1b, M1-2b, M1-B1, M1-B2.

The wire patterns M1-1a, M1-2a, M1-1b, M1-2b, M1-B1, M1-B2 may be formed so as to be electrically connected with the second word lines WL2a, WL2b, the first word lines WL1a, WL1b, and the bit lines BL1, BL2. Specifically, the first wires M1-1a, M1-1b may be connected with the first word lines WL1a, WL1b through the word line contacts MCWa, MCWb. The second wires M1-B1, M1-B2 may be connected with the bit lines BL1, BL2 through the bit line contacts MCB1, MCB2. The third wires M1-2a, M1-2b may be directly connected with the second word lines WL2a, WL2b.

Hereinbelow, a semiconductor device according to some exemplary embodiments will be described with reference to FIG. 3B. Elements or operations overlapping with some exemplary embodiments described above will be mentioned as briefly as possible or omitted for the sake of brevity.

Figure 3B:
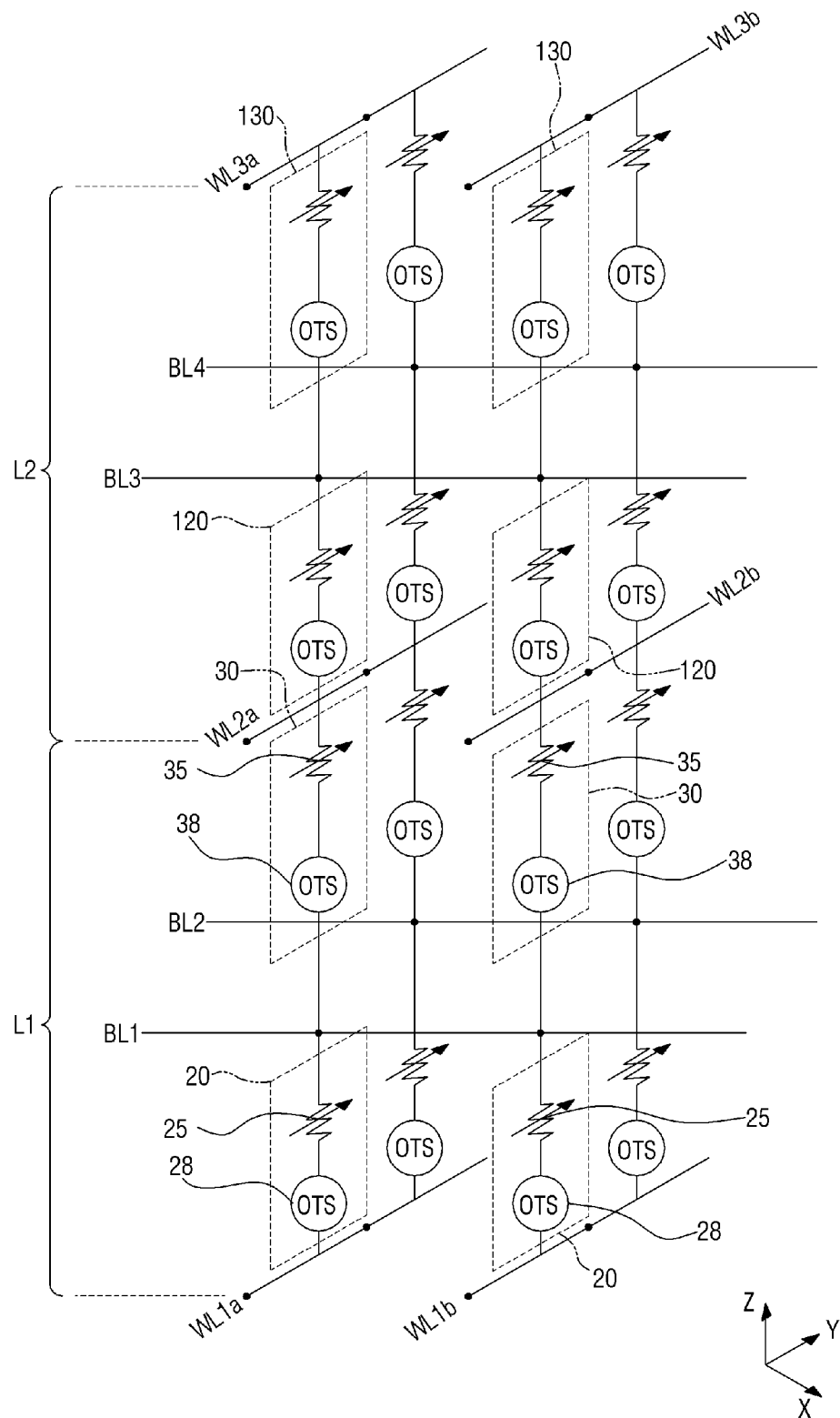
FIG. 3B is a circuit diagram provided to explain a semiconductor device according to some exemplary embodiments.

FIG. 3B is a circuit diagram provided to explain a semiconductor device according to some exemplary embodiments.

Referring to FIG. 3B, in a semiconductor device according to some exemplary embodiments, a second level L2 may be formed on the first level L1. The semiconductor device according to some exemplary embodiments may include many more levels in addition to the two levels. Some exemplary embodiments may additionally include additional bit lines BL3, BL4 and third word lines WL3a, WL3b on the bit lines BL1, BL2.

As illustrated, a third cell 120 and a fourth cell 130 may be added, according to the addition of the bit lines BL3, BL4 and the third word lines WL3a, WL3b.

That is, the structure of the bit lines BL1-BL4 and the first to the third word lines WL1a-WL3b may not be a simple dual-level structure, but a multi-structure. Accordingly, like the first to the fourth cells 20, 30, 120, 130, the memory region may not be a dual-level structure, but a multi-structure having three or more levels.

Hereinbelow, a semiconductor device according to some exemplary embodiments will be described with reference to FIGS. 1 to 3A and 5. Elements or operations overlapping with those described above with reference to FIGS. 1 to 4 will be mentioned as briefly as possible or omitted for the sake of brevity.

Figure 5:
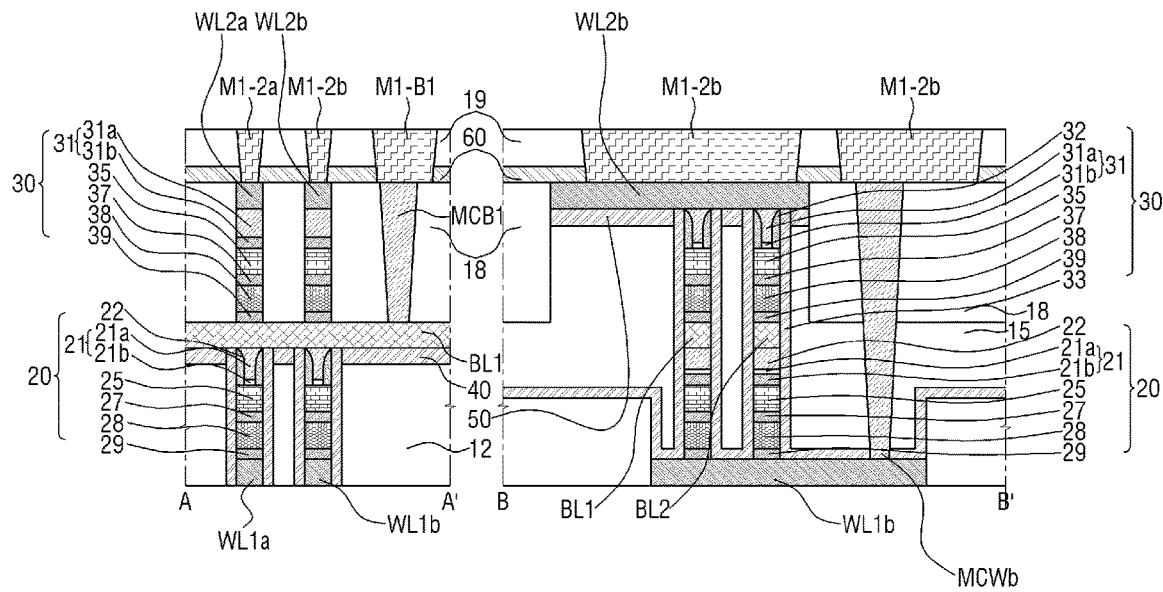
FIG. 5 illustrates cross sectional views provided to explain a semiconductor device according to some exemplary embodiments.

FIG. 5 is a cross sectional view provided to explain a semiconductor device according to some exemplary embodiments. FIG. 5 are cross sectional views taken on lines A-A' and B-B' of FIG. 1.

Referring to FIGS. 1 to 3A and 5, the first upper electrode 21 of the semiconductor device according to some exemplary embodiments may include a first region 21a and a second region 21b.

The first region 21a may be a portion in contact with the first PCM 25. The first region 21a may have a first resistance. The first resistance mentioned above may be a greater resistance than the second resistance of the second region 21b described below. The first region 21a may include, for example, TSN(Ti—SiN). However, exemplary embodiments are not limited to the example given above.

The second region 21b may be formed on the first region 21a. The width of the second region 21b may be greater than the width of the first region 21a. This is because the width of the first spacer 22 decreases in an upward direction. The second resistance of the second region 21b may be a smaller resistance than the first resistance.

Because the resistance of the first region 21a of the first upper electrode 21 is greater than the resistance of the second region 21b, the efficiency of the first upper electrode 21 as a heater may further increase. That is, because heat generation increases according to the square of the current flow and resistance, the resistance of the first region 21a increases, and heat generation may further increase. Accordingly, the efficiency of some exemplary embodiments may be enhanced by increasing the resistance of the first region 21a, which is closer to the first PCM 25.

The second upper electrode 31 of the semiconductor device according to some exemplary embodiments may include a third region 31a and a fourth region 31b.

The third region 31a may be a portion in contact with the second PCM 35. The third region 31a may have a third resistance. The third resistance mentioned above may be a greater resistance than the fourth resistance of the fourth region 31b described below. The third region 31a may include, for example, TSN(Ti—SiN). However, exemplary embodiments are not limited to the example given above.

The fourth region 31b may be formed on the third region 31a. The width of the fourth region 31b may be greater than the width of the third region 31a. This is because the width of the second spacer 32 decreases to in upward direction. The fourth resistance of the fourth region 31b may be a smaller resistance than the third resistance.

Because the resistance of the third region 31a of the second upper electrode 31 is greater than the resistance of the fourth region 31b, the efficiency of the second upper electrode 31 as a heater may further increase. That is, because heat generation increases according to the square of the current flow and resistance, the resistance of the third region 31a increases, and heat generation may further increase. Accordingly, the efficiency of some exemplary embodiments may be enhanced by increasing the resistance of the third region 31a, which is closer to the second PCM 35.

Hereinbelow, a semiconductor device according to some exemplary embodiments will be described with reference to FIGS. 1 to 3A and 6. Elements or operations overlapping with those described above with reference to FIGS. 1 to 5 will be mentioned as briefly as possible or omitted for the sake of brevity.

Figure 6:
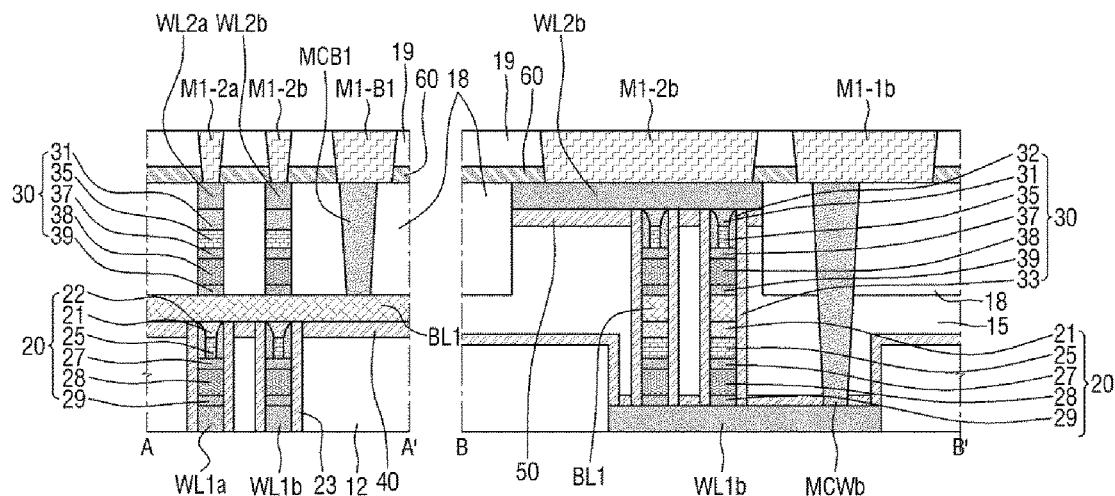
FIG. 6 illustrates cross sectional views provided to explain a semiconductor device according to some exemplary embodiments.

FIG. 6 illustrates cross sectional views provided to explain a semiconductor device according to some exemplary embodiments. FIG. 6 illustrates cross sectional views taken on lines A-A' and B-B' of FIG. 1.

Referring to FIGS. 1 to 3A and 6, the first spacer 22 of the semiconductor device according to some exemplary embodiments may be formed on not only the first upper electrode 21, but also the side surface of the first PCM 25. That is, the first PCM 25 and the first upper electrode 21 may be stacked on the side surface of the first spacer 22.

Accordingly, the width of the first PCM 25 in the second direction Y may be narrower than the width of the first intermediate electrode 27 in the second direction Y. That is, the role of the first upper electrode 21 as a heater may further enhanced, because the cross sectional areas of the first PCM 25 and the first upper electrode 21 are narrowed, while a constant amount of current passes through the first PCM 25 and the first upper electrode 21. Further, because the first PCM 25 likewise has a narrowed cross sectional area, temperature change of the first PCM 25 will also be further facilitated.

Further, the second spacer 32 of the semiconductor device according to some exemplary embodiments may be formed on not only the second upper electrode 31, but also the side surface of the second PCM 35. That is, the second PCM 35 and the second upper electrode 31 may be stacked on the side surface of the second spacer 32.

Accordingly, the width of the second PCM 35 in the first direction X may be narrower than the width of the second intermediate electrode 37 in the first direction X. That is, the role of the second upper electrode 31 as a heater may further enhanced, because the cross sectional areas of the second PCM 35 and the second upper electrode 31 are narrowed, while a constant amount of current passes through the second PCM 35 and the second upper electrode 31. Further, because the second PCM 35 likewise has a narrowed cross sectional area, temperature change of the second PCM 35 will also be further facilitated.

Hereinbelow, a method of fabricating a semiconductor device according to some exemplary embodiments will be described with reference to FIGS. 1, 4 and 7 to 32. Elements or operations overlapping with those described above with reference to FIGS. 1 to 6 will be mentioned as briefly as possible or omitted for the sake of brevity.

FIGS. 7 to 32 are views illustrating intermediate stages of fabrication, provided to explain a method for fabricating a semiconductor device according to some exemplary embodiments. FIGS. 7 to 32 are cross sectional views taken on lines A-A' and B-B' of FIG. 1.

Figure 7:
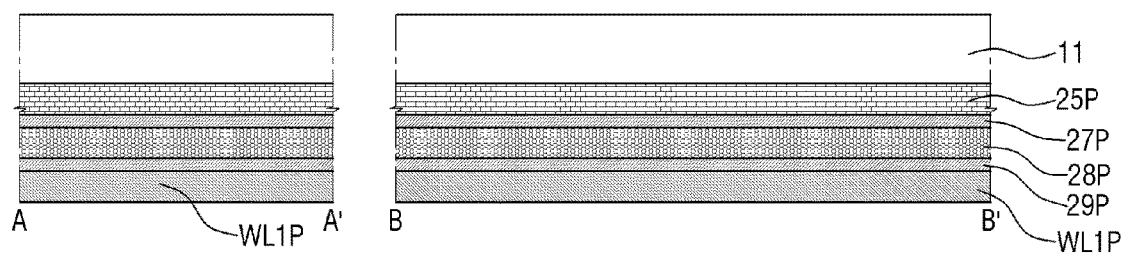
FIGS. 7 to 32 are views illustrating intermediate stages of fabrication, provided to explain a method for fabricating a semiconductor device according to some exemplary embodiments.

Referring to FIG. 7, the first word line film WL1P, a first lower electrode film 29P, a first OTS film 28P, a first intermediate electrode film 27P, a first PCM film 25P, and an interlayer insulating film 11 are formed sequentially.

For example, the first word line film WL1P may include at least one of W or TiN, but not limited thereto.

In this case, the interlayer insulating film 11 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 11 may be HDP, but not limited thereto.

Figure 8:
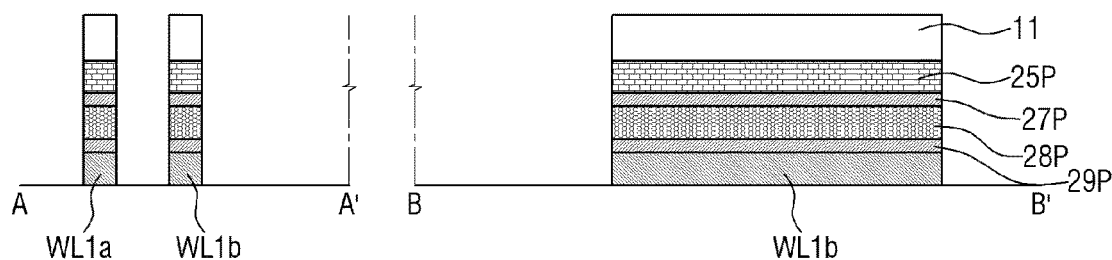

Next, referring to FIG. 8, the first word line film WL1P, the first lower electrode film 29P, the first OTS film 28P, the first intermediate electrode film 27P, the first PCM film 25P, and the interlayer insulating film 11 are patterned.

The first word line film WL1P may be patterned as the first word lines WL1a, WL1b. The first word lines WL1a, WL1b may extend in the first direction X. Because there are a plurality of first word lines WL1a, WL1b provided, these may be spaced apart from one another in the second direction Y.

The first lower electrode film 29P, the first OTS film 28P, the first interlayer insulating film 27P, the first PCM film 25P and the interlayer insulating film 11 may also be stacked on the first word lines WL1a, WL1b in a similar shape as the first word lines WL1a, WL1b. That is, the first lower electrode film 29P, the first OTS film 28P, the first interlayer insulating film 27P, the first PCM film 25P and the interlayer insulating film 11 may extend in the first direction X. Because there are a plurality of first word lines WL1a, WL1b provided, the first lower electrode film 29P, the first OTS film 28P, the first interlayer insulating film 27P, the first PCM film 25P and the interlayer insulating film 11 may also be spaced apart from one another in the second direction Y.

Figure 9:
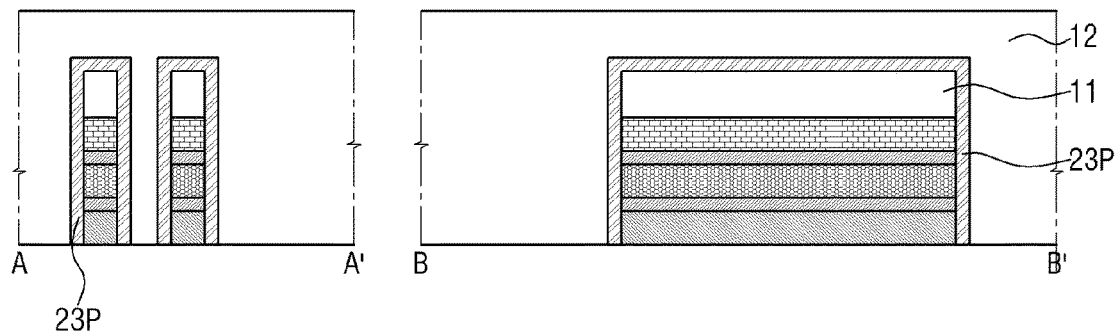

Next, referring to FIG. 9, a first pre-coating film 23P is formed to cover the side surfaces of the first lower electrode film 29P, the first OTS film 28P, the first interlayer insulating film 27P and the first PCM film 25P, and the side surface and the upper surface of the interlayer insulating film 11. The first pre-coating film 23P may include, for example, silicon nitride film.

Next, an interlayer insulating film 12 is formed on the first pre-coating film 23P. The interlayer insulating film 12 may cover the first pre-coating film 23P and fill the remaining empty spaces as illustrated.

In this case, the interlayer insulating film 12 may be, for example, TOSZ, but IS not limited thereto.

Figure 10:
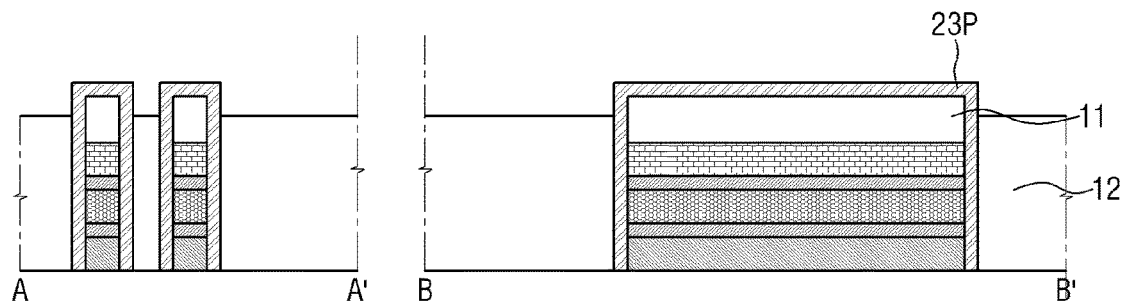

Next, referring to FIG. 10, a portion of the interlayer insulating film 12 is removed by chemical mechanical polanarization (CMP).

At this time, the interlayer insulating film 12 may be removed so that the upper surface of the first pre-coating film 23P is exposed. By the polishing process, the first pre-coating film 23P and the interlayer insulating film 12 may have the same plane. That is, the first pre-coating film 23P may serve as an etch-stop layer in the polishing process.

Next, a portion of the interlayer insulating film 12 is removed, thus exposing a side surface of the first pre-coating film 23P.

That is, by removing a portion of the interlayer insulating film 12, but not the first pre-coating film 23P, the upper surface of the interlayer insulating film 11 may be formed higher than the upper surface of the interlayer insulating film 12. In this case, the process of removing a portion of the interlayer insulating film 12 may be an etch-back process. However, exemplary embodiments are not limited to the example given above.

Figure 11:
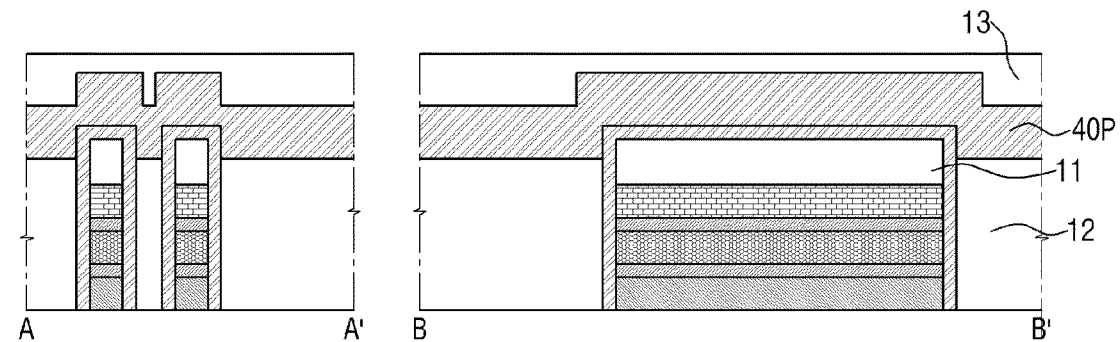

Next, referring to FIG. 11, a first pre-barrier film 40P is formed on the interlayer insulating film 12 and the first pre-coating film 23P.

The first pre-barrier film 40P may be formed conformally along the upper surface and the side surface of the first pre-coating film 23P. The first pre-barrier film 40P may include, for example, a silicon nitride film. However, exemplary embodiments are not limited to the example given above.

Next, an interlayer insulating film 13 is formed on the first pre-barrier film 40P.

In this case, the interlayer insulating film 13 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 13 may be HDP, but is not limited thereto.

Figure 12:
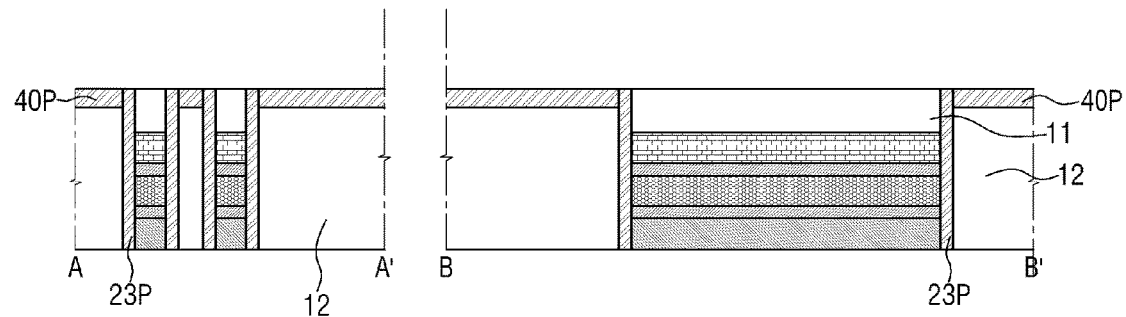

Next, referring to FIG. 12, the interlayer insulating film 11 is exposed by removing the interlayer insulating film 13, the first pre-barrier film 40P and the first pre-coating film 23P.

The interlayer insulating film 13 may be removed entirely. The first pre-barrier film 40P and the first pre-coating film 23P may be partially removed. In this case, the etch-back process may be used. However, exemplary embodiments are not limited to the example given above.

In accordance with the removal of the interlayer insulating film 13, the first pre-barrier film 40P and the first pre-coating film 23P, the upper surface of the interlayer insulating film 11 may be exposed.

Figure 13:
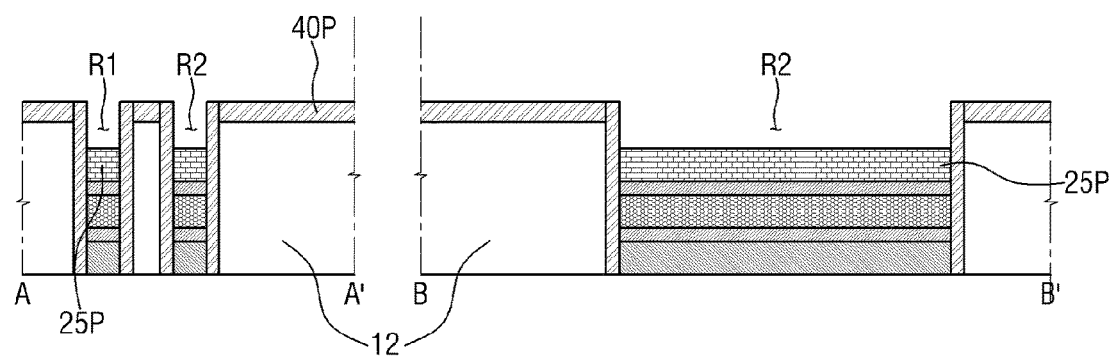

Next, referring to FIG. 13, a first recess R1 and a second recess R2 are formed as the interlayer insulating film 11 is removed.

The first recess R1 and the second recess R2 may be formed so as to be overlapped with the first word lines WL1a, WL1b. The sidewalls of the first recess R1 and the second recess R2 may be the first pre-coating film 23P. The bottom surfaces of the first recess R1 and the second recess R2 may be the first PCM film 25P.

Figure 14:
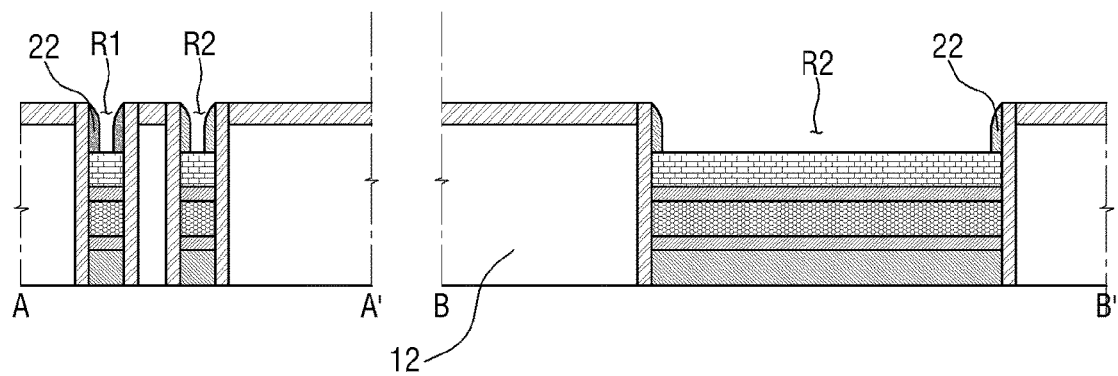

Next, referring to FIG. 14, the first spacer 22 is formed on the sidewall of the first recess R1 and the sidewall of the second recess R2.

The sidewall of the first recess R1 and the sidewall of the second recess R2 may include all of the first direction X sidewall and the second direction Y sidewall. In the cross sectional view taken on A-A' of FIG. 14, the first spacer 22 formed on the first direction X sidewall can be seen. In the cross sectional view taken on B-B' of FIG. 14, the first spacer 22 formed on the second direction Y sidewall can be seen.

The first spacer 22 may be formed in a manner in which the first spacer film in the liner form is deposited and then a portion of the first spacer film is removed. In this case, as for the manner of removing, the etch-back process may be used, although exemplary embodiments are not limited thereto.

Figure 15:
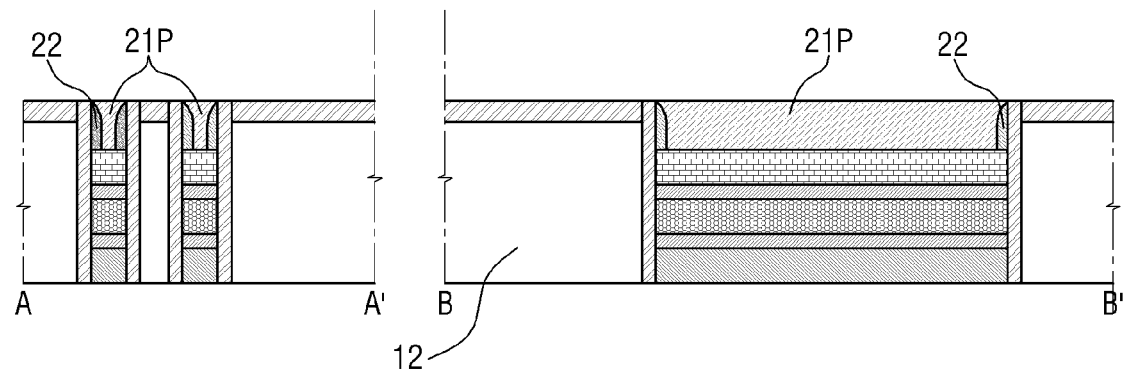

Next, referring to FIG. 15, a first upper electrode film 21P is formed.

The first upper electrode film 21P may entirely fill the first recess R1 and the second recess R2. The first upper electrode film 21P may be formed on the first PCM film 25P. The first upper electrode film 21P may be formed so as to entirely fill the first recess R1 and the second recess R2 and cover the first pre-barrier film 40P, and may then have the same plane as the first pre-barrier film 40P by chemical physical polishing.

Figure 16:
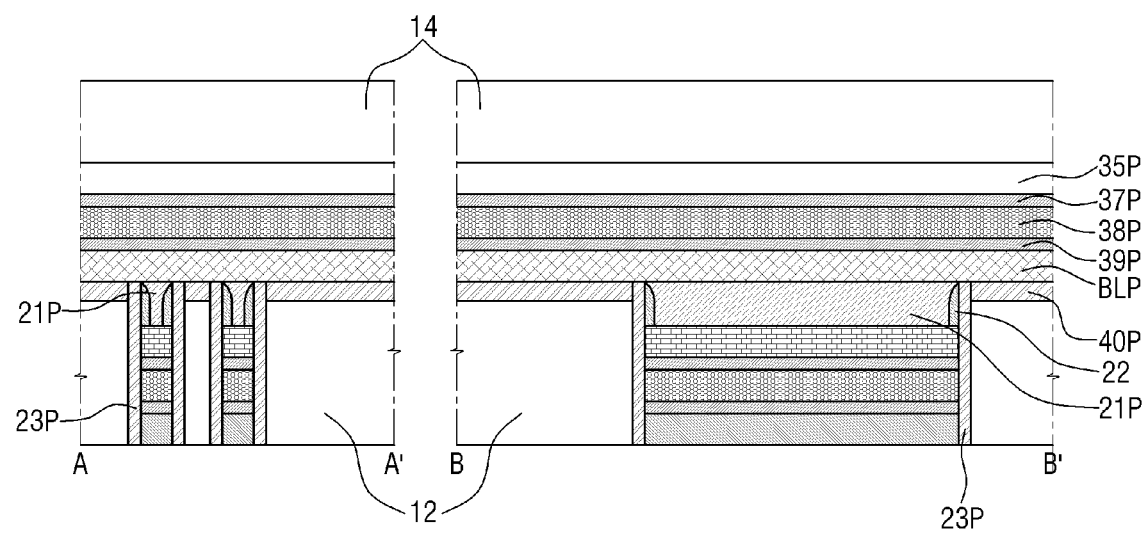

Next, referring to FIG. 16, on the first pre-barrier film 40P and the first upper electrode film 21P, a bit line film BLP, a second lower electrode film 39P, a second OTS film 38P, a second intermediate electrode film 37P, a second PCM film 35P and an interlayer insulating film 14 are sequentially formed.

At this time, the bit line film BLP may be at least one of W or TiN, for example, but not limited thereto.

In this case, the interlayer insulating film 14 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 14 may be HDP, but is not limited thereto.

Figure 17:
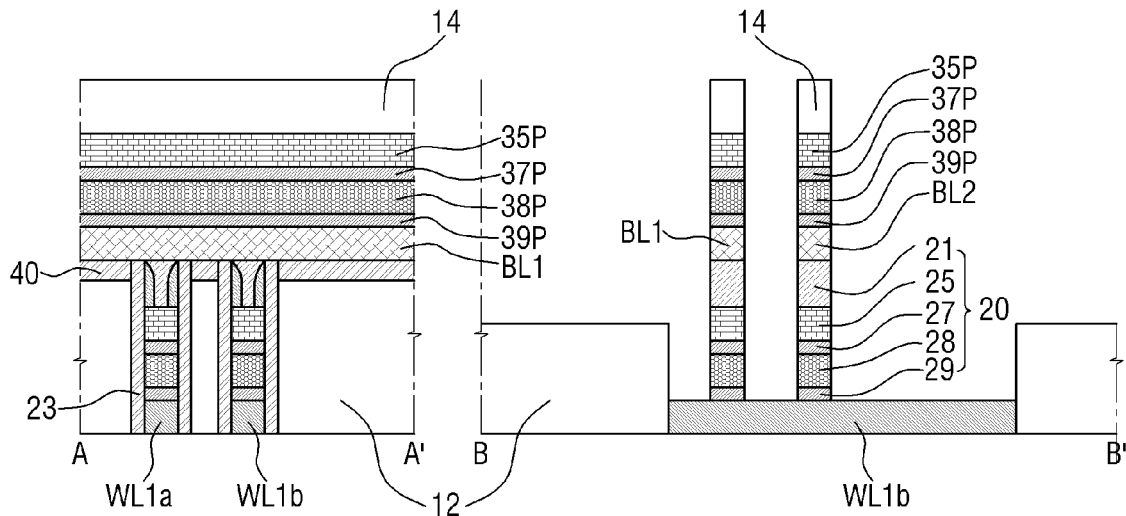

Next, referring to FIG. 17, the first lower electrode film 29P, the first OTS film 28P, the first intermediate electrode film 27P, the first PCM film 25P, the interlayer insulating film 12, the first pre-coating film 23P, the first pre-barrier film 40P, the bit line film BLP, the second lower electrode film 39P, the second OTS film 38P, the second intermediate electrode film 37P, the second PCM film 35P and the interlayer insulating film 14 are patterned.

The first lower electrode film 29P, the first OTS film 28P, the first intermediate electrode film 27P and the first PCM film 25P may be patterned so as to be positioned in the intersect regions CA. Accordingly, the first lower electrode film 29P, the first OTS film 28P, the first intermediate electrode film 27P, and the first PCM film 25P may be patterned as the first lower electrode 29, the first OTS 28, the first intermediate electrode 27 and the first PCM 25, respectively.

The interlayer insulating film 12, the first pre-coating film 23P, the first pre-barrier film 40P, the bit line film BLP, the second lower electrode film 39P, the second OTS film 38P, the second intermediate electrode film 37P, the second PCM film 35P and the interlayer insulating film 14 may be patterned so as to extend in the second direction. As a result, the first pre-coating film 23P, the first pre-barrier film 40P and the bit line film BLP may be patterned as the first coating film 23, the first barrier film 40 and the bit lines BL1, BL2, respectively.

Figure 18:
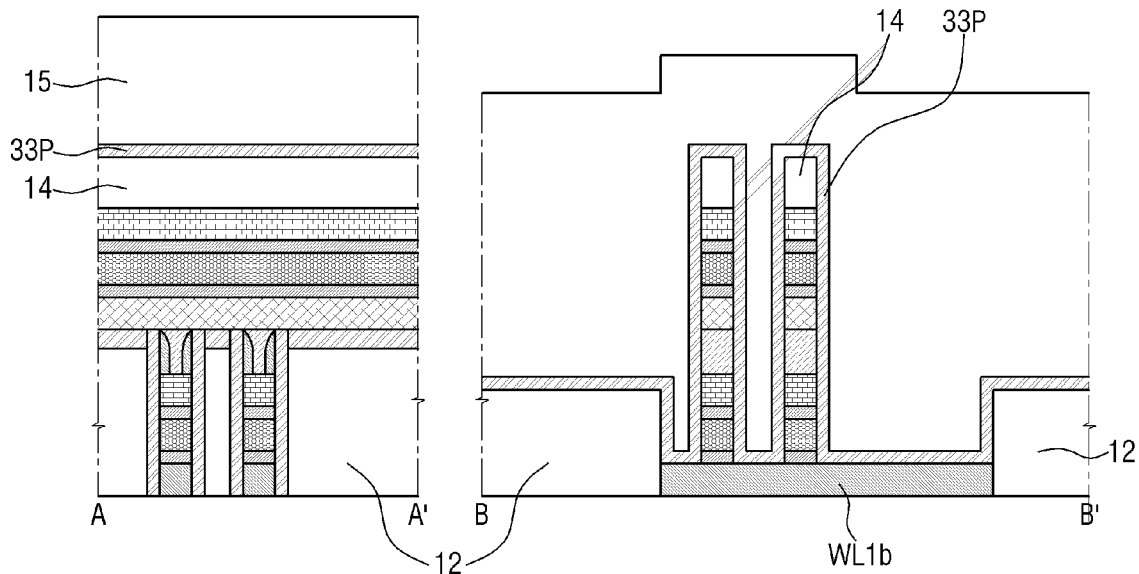

Next, referring to FIG. 18, the second pre-coating film 33P is formed.

The second pre-coating film 33P may be formed along the side surfaces of the first lower electrode 29, the first OTS 28, the first intermediate electrode 27, the first PCM 25, the bit lines BL1, BL2, the second lower electrode film 39P, the second OTS film 38P, the second intermediate electrode film 37P and the second PCM film 35P, and the side surface and the upper surface of the interlayer insulating film 14.

Further, the second pre-coating film 33P may be formed along the upper surfaces of the first word lines WL1a, WL1b, and the upper surface and the side surface of the interlayer insulating film 12.

For example, the second pre-coating film 33P may include silicon nitride film, but not limited thereto.

Next, an interlayer insulating film 15 is formed on the second pre-coating film 33P.

For example, the interlayer insulating film 15 may be TOSZ, but is not limited thereto.

Figure 19:
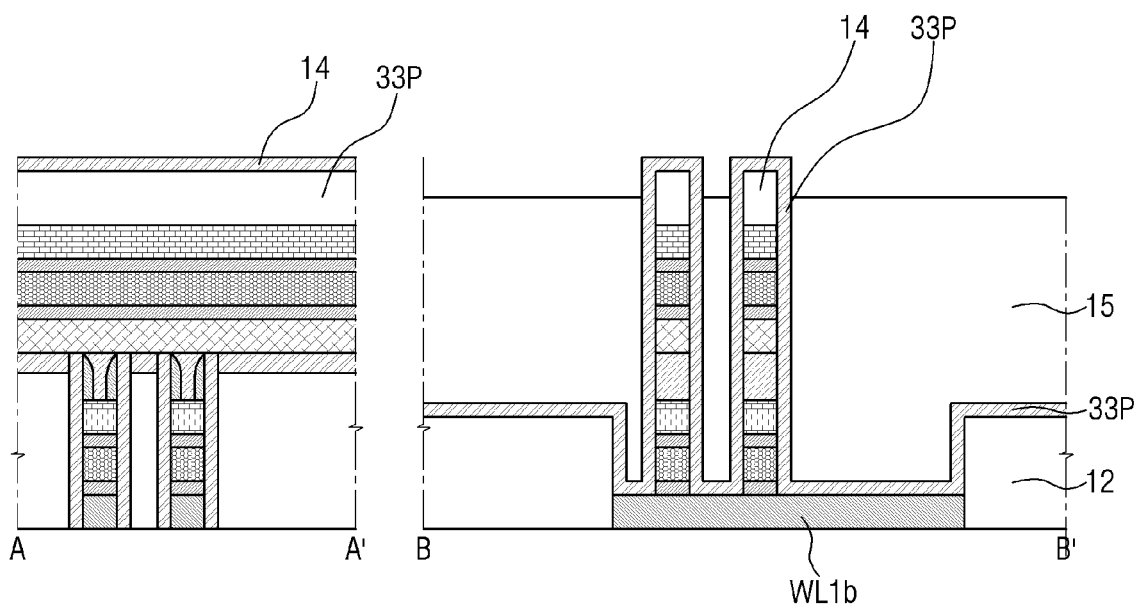

Next, referring to FIG. 19, a portion of the interlayer insulating film 15 is removed by chemical physical polishing (CMP).

At this time, the interlayer insulating film 15 may be removed so that the upper surface of the second pre-coating film 33P is exposed. By the polishing process, the second pre-coating film 33P and the interlayer insulating film 15 may have the same plane. That is, the second pre-coating film 33P may serve as an etch-stop layer in the polishing process.

Next, the side surface of the second pre-coating film 33P is exposed by removing a portion of the interlayer insulating film 15.

That is, by removing a portion of the interlayer insulating film 15, but not the first pre-coating film 33P, the upper surface of the interlayer insulating film 14 may be formed higher than the upper surface of the interlayer insulating film 15. In this case, the process of removing a portion of the interlayer insulating film 15 may be the etch-back process. However, exemplary embodiments are not limited to the example given above.

Figure 20:
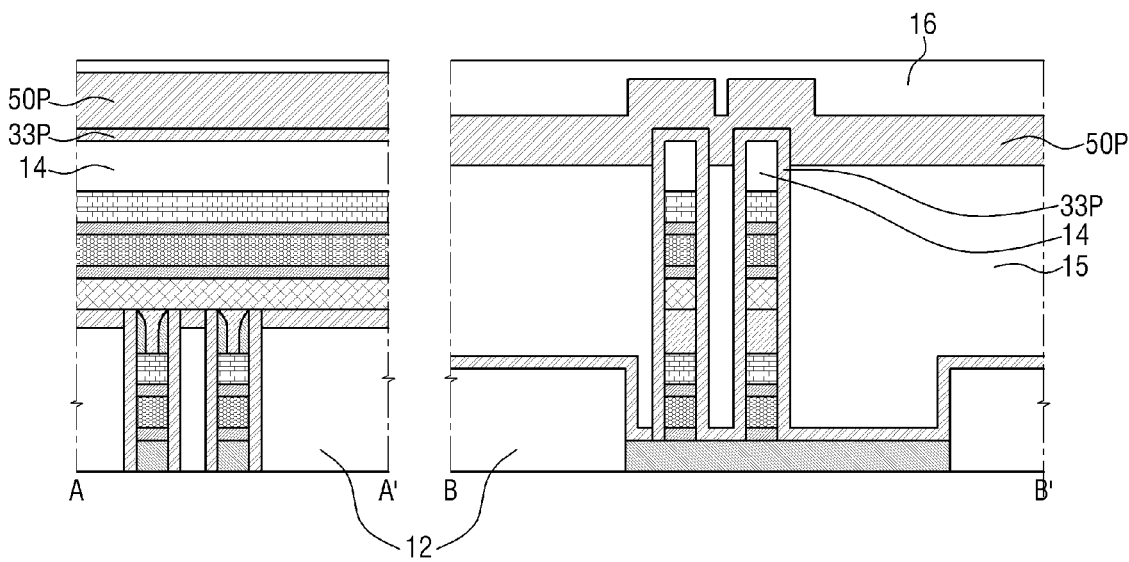

Next, referring to FIG. 20, a second pre-barrier film 50P is formed on the interlayer insulating film 15 and the second pre-coating film 33P.

The second pre-barrier film 50P may be formed conformally along the upper surfaces and the side surfaces of the interlayer insulating film 15 and the second pre-coating film 33P. The second pre-barrier film 50P may include, for example, silicon nitride film. However, exemplary embodiments are not limited to the example given above.

Next, an interlayer insulating film 16 is formed on the second pre-barrier film 50P.

In this case, the interlayer insulating film 16 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 16 may be HDP, but is not limited thereto.

Figure 21:
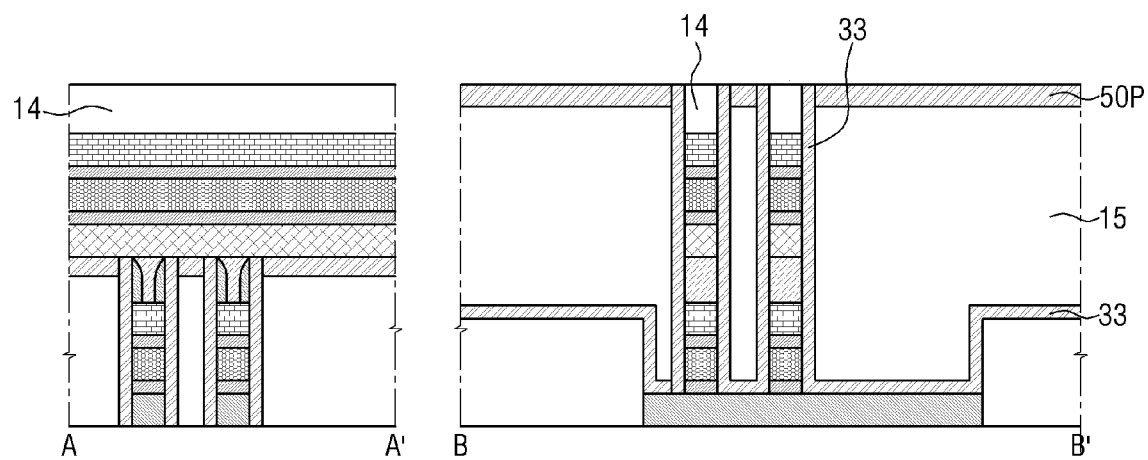

Next, referring to FIG. 21, the interlayer insulating film 14 is exposed by removing the interlayer insulating film 16, the second pre-barrier film 50P and the second pre-coating film 33P.

The interlayer insulating film 16 may be removed entirely. The second pre-barrier film 50P and the second pre-coating film 33P may be partially removed. In this case, the etch-back process may be used. However, exemplary embodiments are not limited to the example given above.

In accordance with the partial removal of the second pre-coating film 33P, the second pre-coating film 33P may become the second coating film 33.

In accordance with the removal of the interlayer insulating film 16, the second pre-barrier film 50P and the second pre-coating film 33P, the upper surface of the interlayer insulating film 14 may be exposed.

Figure 22:
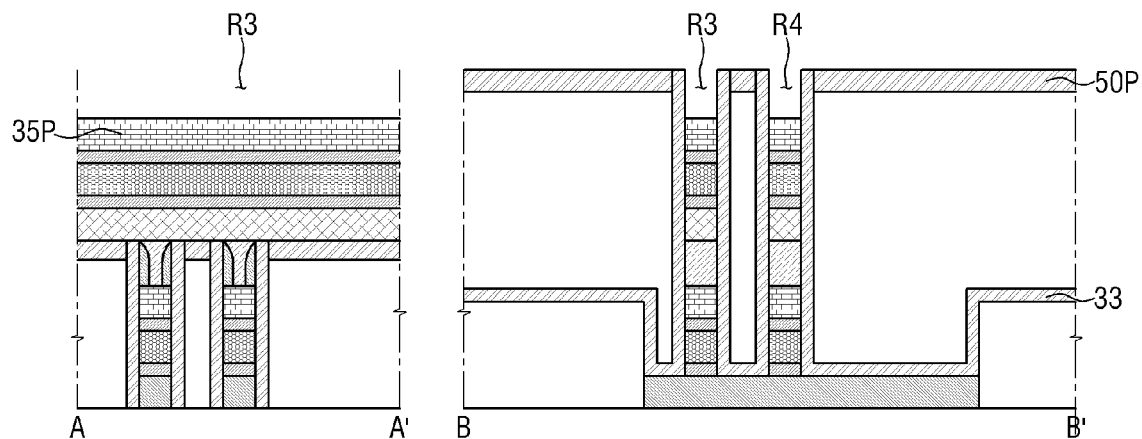

Next, referring to FIG. 22, a third recess R3 and a fourth recess R4 are formed as the interlayer insulating film 14 is removed.

The third recess R3 and the fourth recess R4 may be formed so as to be overlapped with the bit lines BL1, BL2. The sidewalls of the third recess R3 and the fourth recess R4 may be the second coating film 33. The bottom surfaces of the third recess R3 and the fourth recess R4 may be the second PCM film 35P.

Figure 23:
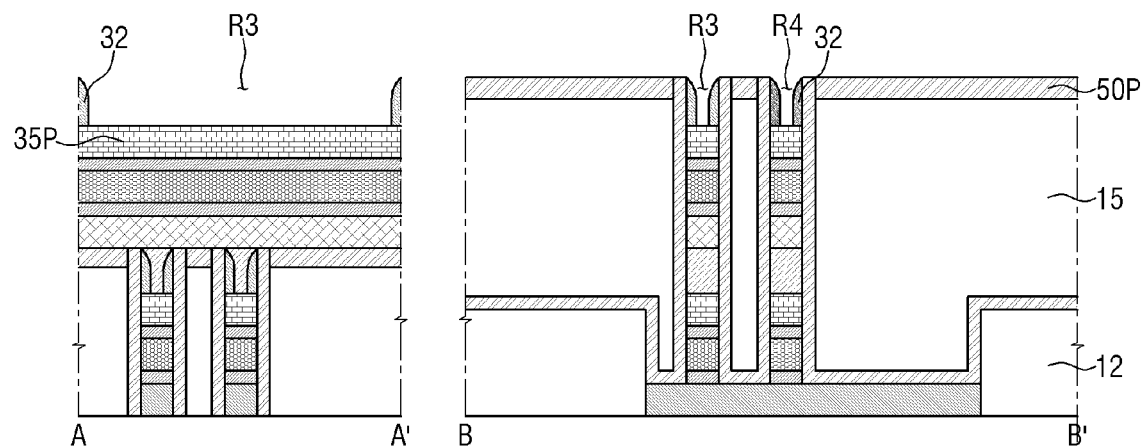

Next, referring to FIG. 23, the second spacer 32 is formed on the sidewall of the third recess R3 and the sidewall of the fourth recess R4.

The sidewall of the third recess R3 and the sidewall of the fourth recess R4 may include all of the first direction X sidewall and the second direction Y sidewall. In the cross sectional view taken on A-A' of FIG. 23, the second spacer 32 formed on the first direction X sidewall can be seen. In the cross sectional view taken on B-B' of FIG. 23, the second spacer 32 formed on the second direction Y sidewall can be seen.

The second spacer 32 may be formed in a manner in which the second spacer film in the liner form is deposited and then a portion of the second spacer film is removed. In this case, as for the manner of removing, the etch-back process may be used, although exemplary embodiments are not limited thereto.

Figure 24:
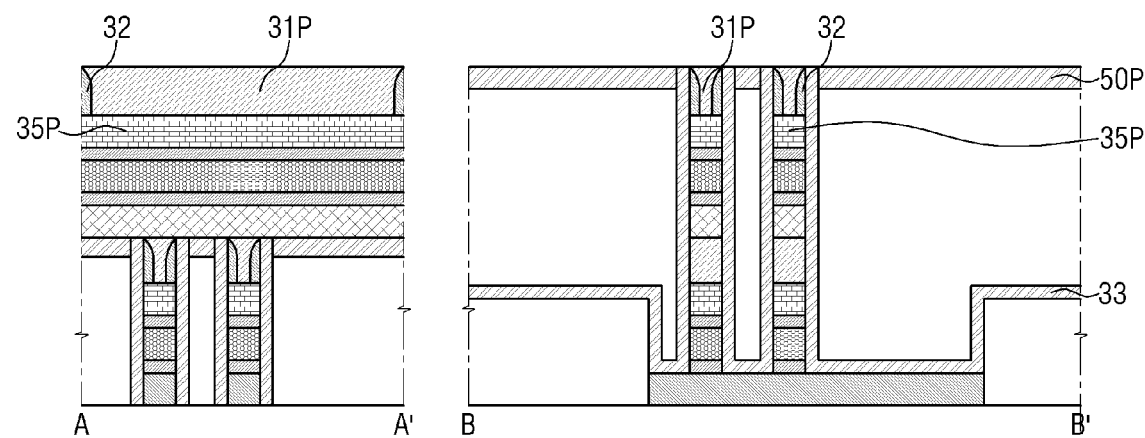

Next, referring to FIG. 24, a second upper electrode film 31P is formed.

The second upper electrode film 31P may entirely fill the third recess R3 and the fourth recess R4. The second upper electrode film 31P may be formed on the second PCM film 35P. The second upper electrode film 31P may be formed so as to entirely fill the third recess R3 and the fourth recess R4 and cover the second pre-barrier film 50P, and may then have the same plane as the second pre-barrier film 50P by the chemical physical polishing.

Figure 25:
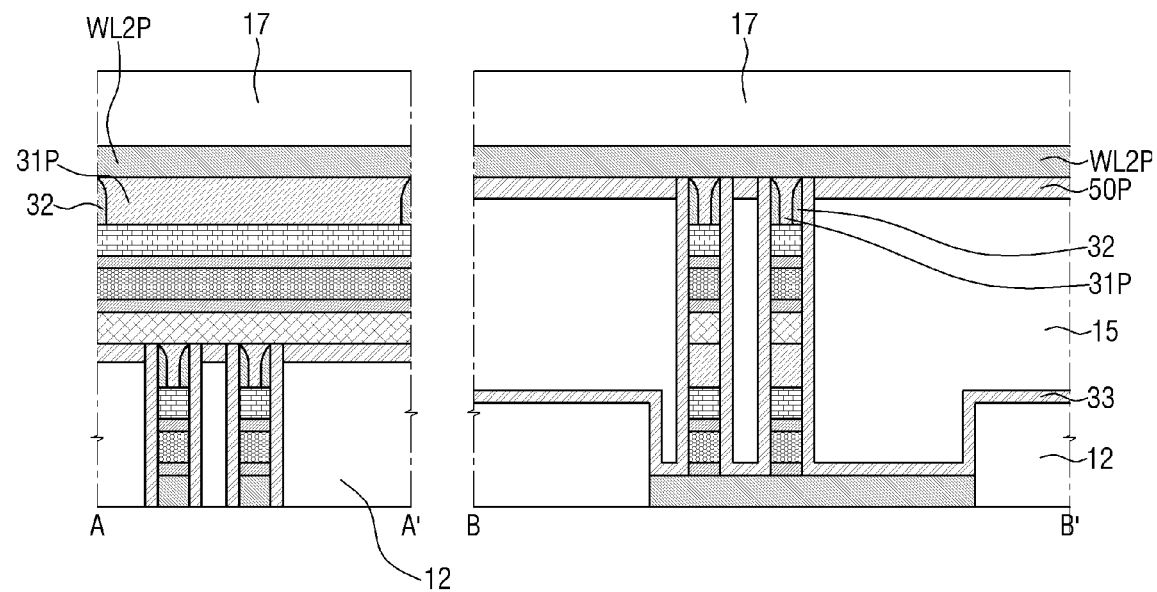

Next, referring to FIG. 25, a second word line film WL2P and an interlayer insulating film 17 are sequentially formed on the second pre-barrier film 50P and the second upper electrode film 31P.

For example, the second word line film WL2P may include at least one of W or TiN, but is not limited thereto.

In this case, the interlayer insulating film 17 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 17 may be HDP, but is not limited thereto.

Figure 26:
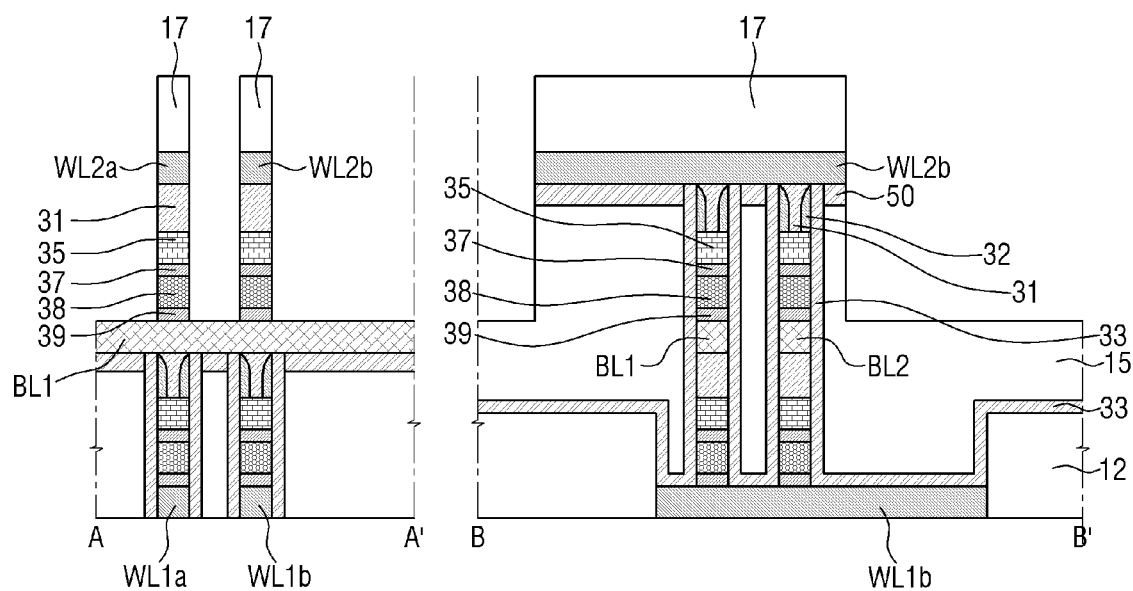

Next, referring to FIG. 26, the interlayer insulating film 15, the second pre-barrier film 50P, the second lower electrode film 39P, the second OTS film 38P, the second intermediate electrode film 37P, the second PCM film 35P, the second upper electrode film 31P, the second word line film WL2P and the interlayer insulating film 17 are patterned.

The second lower electrode film 39P, the second OTS film 38P, the second intermediate electrode film 37P, the second PCM film 35P and the second upper electrode film 31P may be patterned so as to be positioned in the intersect regions CA. Accordingly, the second lower electrode film 39P, the second OTS film 38P, the second intermediate electrode film 37P, the second PCM film 35P and the second upper electrode film 31P may be patterned as the second lower electrode 39, the second OTS 38, the second intermediate electrode 37, the second PCM 35 and the second upper electrode 31, respectively.

The interlayer insulating film 17, the second pre-barrier film 50P, the second word line film WL2P and the interlayer insulating film 15 may be patterned so as to extend in the first direction X. Further, the interlayer insulating film 17, the second pre-barrier film 50P, the second word line film WL2P and the interlayer insulating film 15 may be patterned so as to be overlapped with a portion of the first word lines WL1a, WL1b. As a result, the second pre-barrier film 50P and the second word line film WL2P may be patterned as the second barrier film 50 and the second word lines WL2a, WL2b, respectively.

Figure 27:
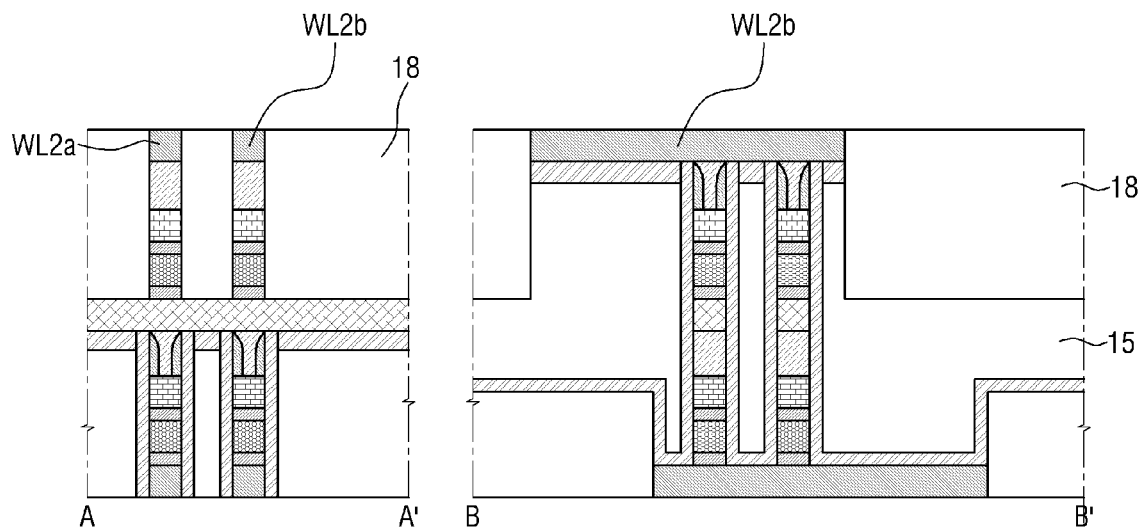

Next, referring to FIG. 27, an interlayer insulating film 18 is formed on the interlayer insulating film 15.

For example, the interlayer insulating film 18 may be TOSZ, but is not limited thereto.

Next, the interlayer insulating film 17 and the interlayer insulating film 18 may be removed by a planarization process and the etch-back process. As a result, the upper surfaces of the second word lines WL2a, WL2b may be exposed. The upper surfaces of the second word lines WL2a, WL2b and the interlayer insulating film 18 may be in the same plane.

Figure 28:
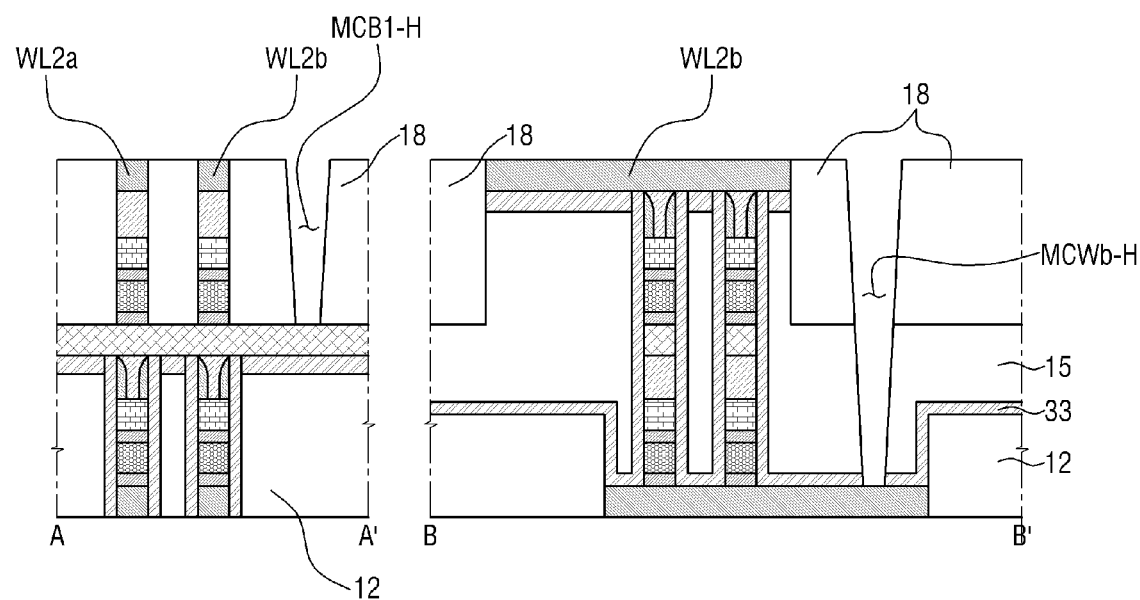

Next, referring to FIG. 28, contact holes MCWa-H (not shown in FIG. 28), MCWb-H, MCB1-H, MCB2-H (not shown in FIG. 28) penetrating through the interlayer insulating films 15, 18 and the second coating film 33 are formed.

The contact holes MCWa-H, MCWb-H, MCB1-H, MCB2-H include first word line contact holes MCWa-H, MCWb-H, and bit line contact holes MCB1-H, MCB2-H. The first word line contact holes MCWa-H, MCWb-H may expose the upper surfaces of the first word lines WL1a, WL1b. The first word lines WL1a, WL1b include overlap regions overlapped with the bit lines BL1, BL2 and the second word lines WL2a, WL2b, and non-overlap regions not overlapped with the bit lines BL1, BL2 or the second word lines WL2a, WL2b. The first word line contact holes MCWa-H, MCWb-H may expose the non-overlap regions.

The first word line contact holes MCWa-H, MCWb-H may be formed by penetrating through the interlayer insulating films 15, 18 and the second coating film 33.

The bit line contact holes MCB1-H, MCB2-H may expose the upper surfaces of the bit lines BL1, BL2. The bit line contact holes MCB1-H, MCB2-H may also expose the first word lines WL1a, WL1b and regions not overlapped with the second word lines WL2a, WL2b.

The bit line contact holes MCB1-H, MCB2-H may be formed by penetrating through the interlayer insulating film 18.

Figure 29:
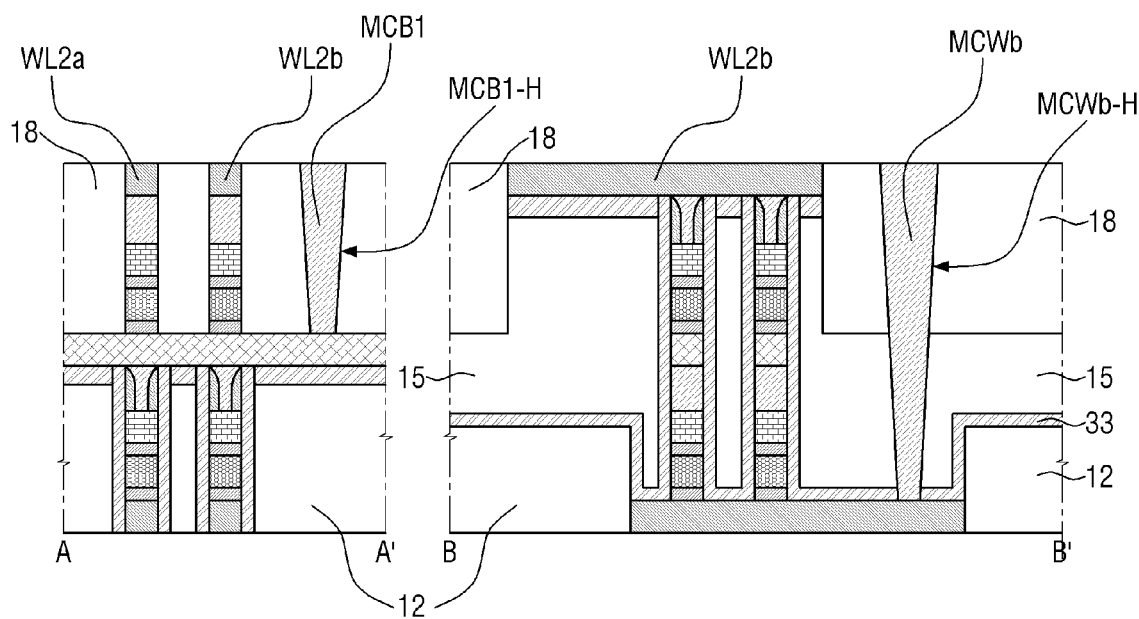

Next, referring to FIG. 29, contacts MCWa (not shown in FIG. 29), MCWb, MCB1, MCB2 (not shown in FIG. 29) are formed.

The contacts MCWa, MCWb, MCB1, MCB2 include first word line contacts MCWa, MCWb and bit line contacts MCB1, MCB2. The first word line contacts MCWa, MCWb fill the first word line contact holes MCWa-H, MCWb-H, and the bit line contacts MCB1, MCB2 fill the bit line contact holes MCB1-H, MCB2-H. For example, the contacts include at least one of W or TiN. However, exemplary embodiments are not limited to the example given above.

Figure 30:
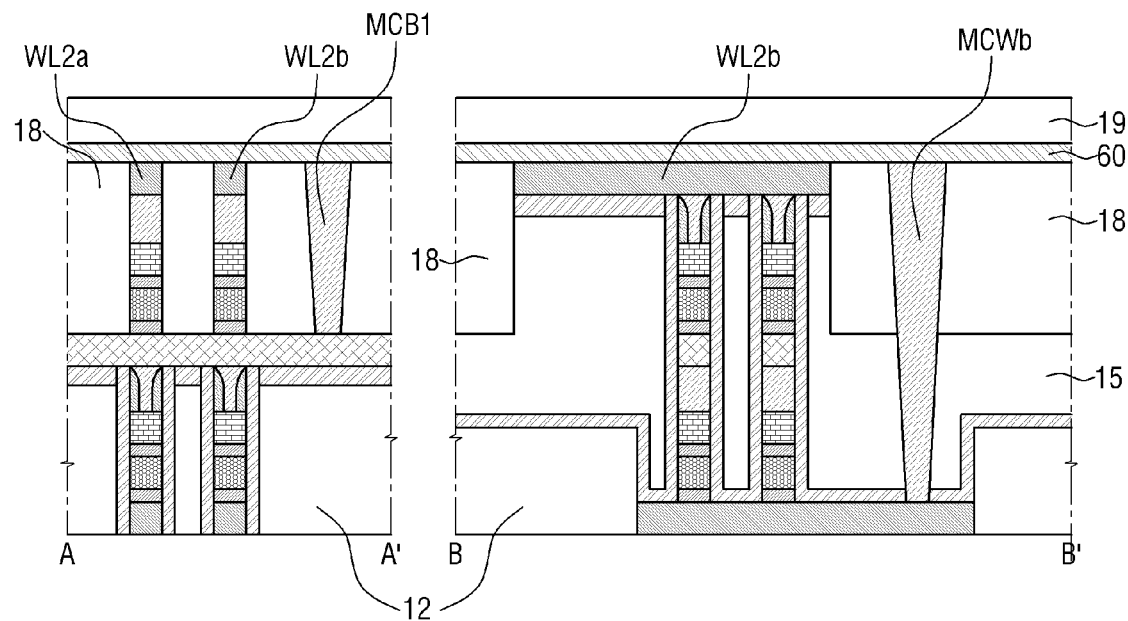

Next, referring to FIG. 30, a nitride film 60 and an interlayer insulating film 19 are sequentially formed.

The nitride film 60 may be formed on the second word lines WL2a, WL2b, the contacts MCWa, MCWb, MCB1, MCB2 and the interlayer insulating film 18. The interlayer insulating film 19 may be formed on the nitride film 60.

For example, the nitride film 60 may include a silicon nitride film. However, exemplary embodiments are not limited to the example given above.

In this case, the interlayer insulating film 19 may be silicon oxide (SiOx) films, such as at least one of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass) or HDP (high density plasma). For example, the interlayer insulating film 19 may be TEOS, but is not limited thereto.

Figure 31:
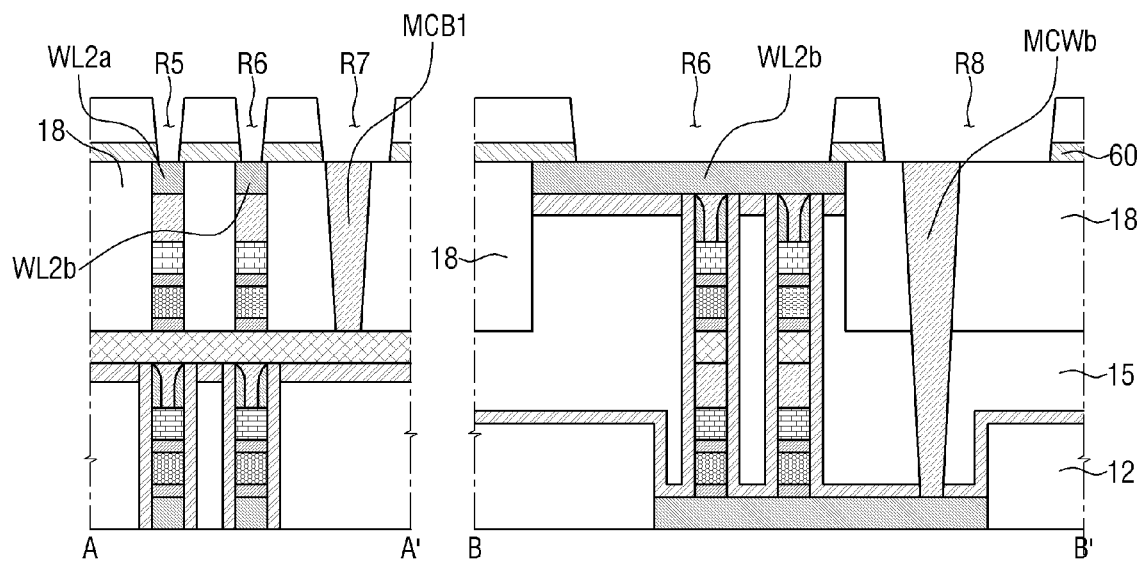

Next, referring to FIG. 31, a fifth recess R5, a sixth recess R6, a seventh recess R7 and an eighth recess R8 are formed by patterning the nitride film 60 and the interlayer insulating film 19. The fifth recess R5 and the sixth recess R6 may expose the upper surfaces of the second word lines WL2a, WL2b. The seventh recess R7 may expose the upper surface of the bit line contacts MCB1, MCB2, and the eighth recess R8 may expose the upper surfaces of the first word line contacts MCWa, MCWb.

Figure 32:
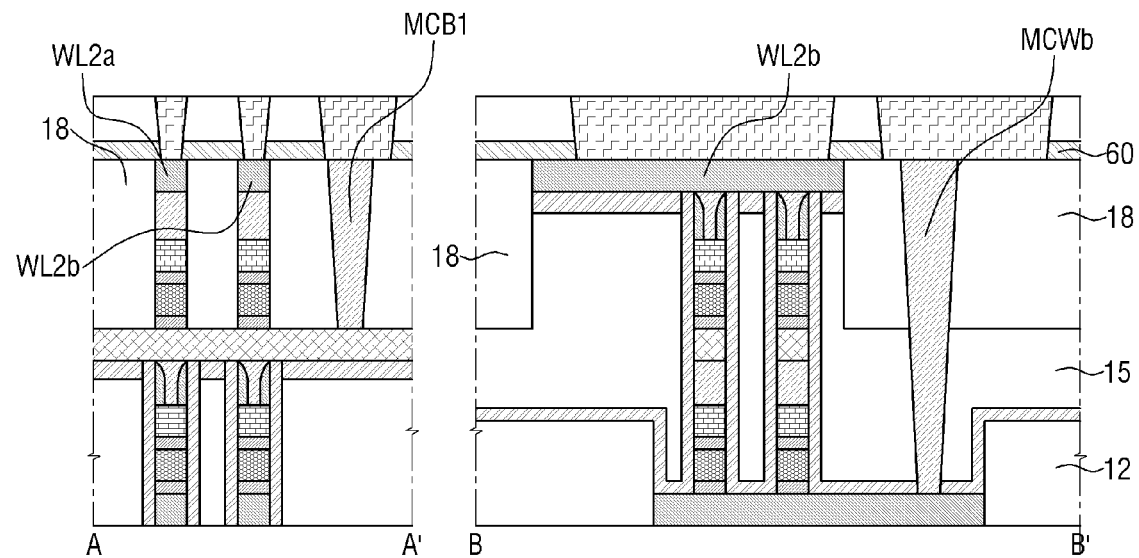

Next, referring to FIG. 32, wire patterns M1-1a, M1-2a, M1-1b, M1-2b, M1-B1, M1-B2 are formed.

Among the wire patterns M1-1a, M1-2a, M1-1b, M1-2b, M1-B1, M1-B2, the first wires M1-1a, M1-1b may fill the eighth recess R8 to connect with the first word line contacts MCWa, MCWb. Among the wire patterns M1-1a, M1-2a, M1-1b, M1-2b, M1-B1, M1-B2, the second wires M1-B1, M1-B2 may fill the seventh recess R7 to connect with the bit line contacts MCB1, MCB2. Among the wire patterns M1-1a, M1-2a, M1-1b, M1-2b, M1-B1, M1-B2, the third wires M1-2a, M1-2b may fill the fifth recess R5 and the sixth recess R6 to connect with the first word line contacts MCWa, MCWb.

Hereinbelow, a method of fabricating a semiconductor device according to some exemplary embodiments will be described with reference to FIGS. 1 to 4 and 33 to 48. Elements or operations overlapping with the exemplary embodiments described above with reference to FIGS. 1 to 32 will be mentioned as briefly as possible or omitted for the sake of brevity.

FIGS. 33 to 48 are views illustrating intermediate stages of fabrication, provided to explain a method for fabricating a semiconductor device according to some exemplary embodiments. FIGS. 33 to 48 are cross sectional views taken on lines A-A' and B-B' of FIG. 1.

Figure 33:
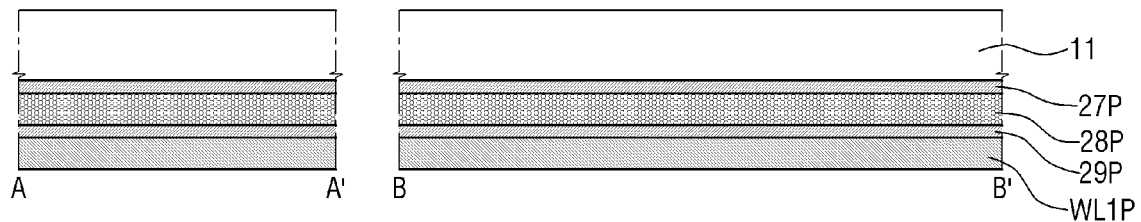
FIGS. 33 to 48 are views illustrating intermediate stages of fabrication, provided to explain a method for fabricating a semiconductor device according to some exemplary embodiments.

Referring to FIG. 33, the first word line film WL1P, the first lower electrode film 29P, the first OTS film 28P, the first intermediate electrode film 27P and the interlayer insulating film 11 are formed sequentially.

Figure 34:
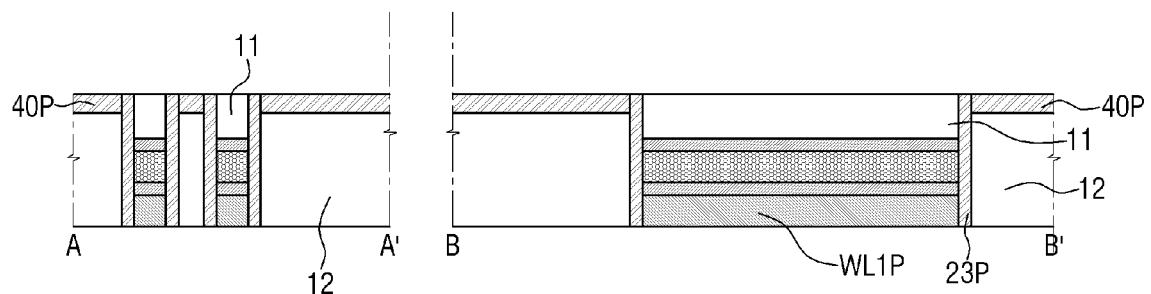

Next, referring to FIG. 34, the first word lines WL1$a$, WL1$b$, the interlayer insulating film 12, the first pre-coating film 23P and the first pre-barrier film 40P are formed.

The first word line film WL1P may be patterned as the first word lines WL1$a$, WL1$b$. The first word lines WL1$a$, WL1$b$ may extend in the first direction X. Because there are a plurality of first word lines WL1$a$, WL1$b$ provided, these may be spaced apart from one another in the second direction Y.

The first pre-coating film 23P may be formed on the side surfaces of the first word line film WL1P, the first lower electrode film 29P, the first OTS film 28P, the first intermediate electrode film 27P and the interlayer insulating film 11. The interlayer insulating film 12 may be formed on the side surface of the first pre-coating film 23P.

The first pre-barrier film 40$p$ may be formed on the interlayer insulating film 12 and have an upper surface in the same plane as the upper surface of the interlayer insulating film 11.

Figure 35:
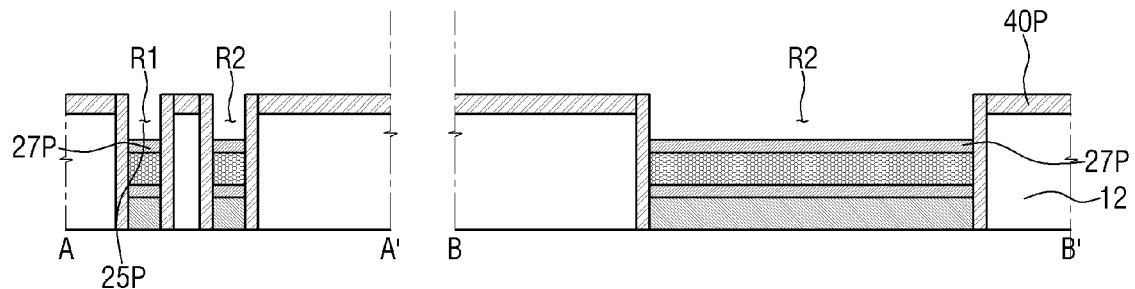

Next, referring to FIG. 35, the first recess R1 and the second recess R2 are formed as the interlayer insulating film 11 is removed.

The first recess R1 and the second recess R2 may be formed so as to be overlapped with the first word lines WL1$a$, WL1$b$. The sidewalls of the first recess R1 and the second recess R2 may be the first pre-coating film 23P. The bottom surfaces of the first recess R1 and the second recess R2 may be the first intermediate electrode film 27P.

Figure 36:
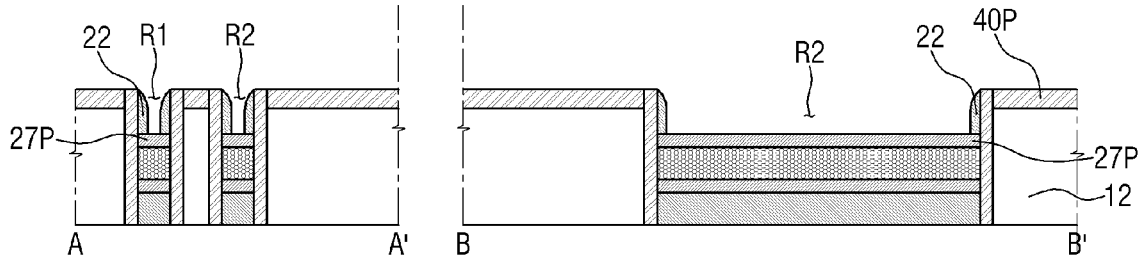

Next, referring to FIG. 36, the first spacer 22 is formed on the sidewall of the first recess R1 and the sidewall of the second recess R2.

The sidewall of the first recess R1 and the sidewall of the second recess R2 may include all of the first direction X sidewall and the second direction Y sidewall. In the cross sectional view taken on A-A' of FIG. 36, the first spacer 22 formed on the first direction X sidewall can be seen. In the cross sectional view taken on B-B' of FIG. 36, the first spacer 22 formed on the second direction Y sidewall can be seen.

The first spacer 22 may be formed in a manner in which the first spacer film in the liner form is deposited and then a portion of the first spacer film is removed. In this case, as for the manner of removing, the etch-back process may be used, although exemplary embodiments are not limited thereto.

Figure 37:
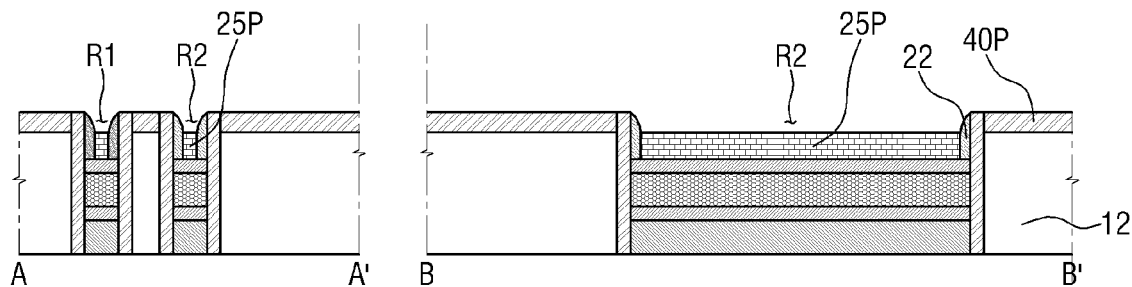

Next, referring to FIG. 37, the first PCM film 25P is formed.

The first PCM film 25P may fill a portion of the first recess R1 and a portion of the second recess R2. The first PCM film 25P may be formed on the first intermediate electrode film 27P.

Figure 38:
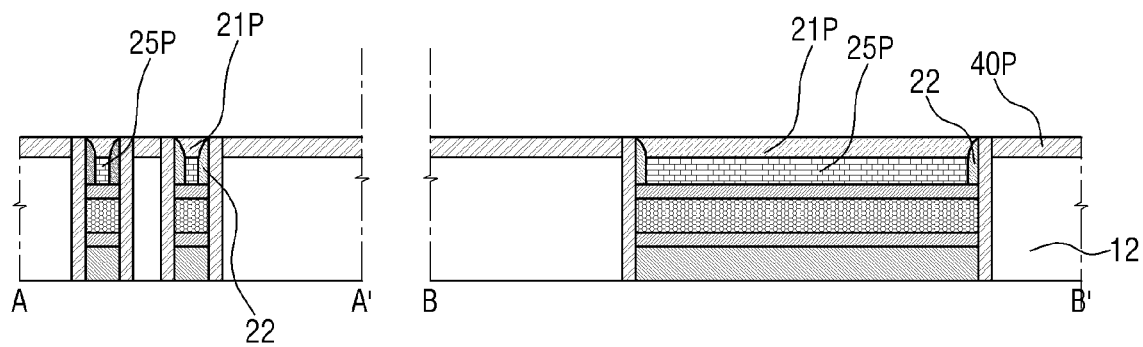

Next, referring to FIG. 38, the first upper electrode film 21P is formed.

The first upper electrode film 21P may entirely fill the first recess R1 and the second recess R2. The first upper electrode film 21P may be formed on the first PCM film 25P. The first upper electrode film 21P may be formed so as to entirely fill the first recess R1 and the second recess R2 and cover the first pre-barrier film 40P, and may then have the same plane as the first pre-barrier film 40P by chemical physical polishing.

Figure 39:
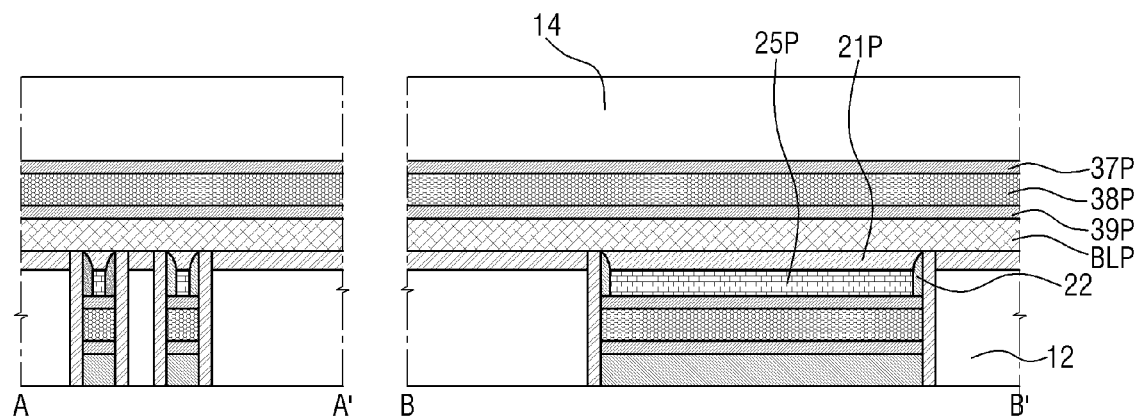

Next, referring to FIG. 39, on the first pre-barrier film 40P and the first upper electrode film 21P, the bit line film BLP, the second lower electrode film 39P, the second OTS film 38P, the second intermediate electrode film 37P, and the interlayer insulating film 14 are sequentially formed.

Figure 40:
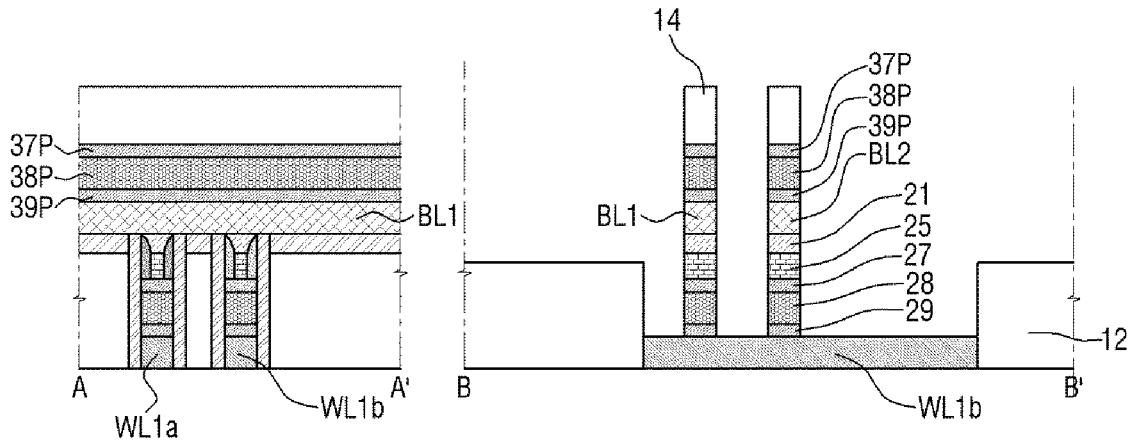

Next, referring to FIG. 40, the first lower electrode film 29P, the first OTS film 28P, the first intermediate electrode film 27P, the first PCM film 25P, the interlayer insulating film 12, the first pre-coating film 23P, the first pre-barrier film 40P, the bit line film BLP, the second lower electrode film 39P, the second OTS film 38P, the second intermediate electrode film 37P and the interlayer insulating film 14 are patterned.

The first lower electrode film 29P, the first OTS film 28P, the first intermediate electrode film 27P and the first PCM film 25P may be patterned so as to be positioned in the intersect regions CA. Accordingly, the first lower electrode film 29P, the first OTS film 28P, the first intermediate electrode film 27P, and the first PCM film 25P may be patterned as the first lower electrode 29, the first OTS 28, the first intermediate electrode 27 and the first PCM 25, respectively.

The interlayer insulating film 12, the first pre-coating film 23P, the first pre-barrier film 40P, the bit line film BLP, the second lower electrode film 39P, the second OTS film 38P, the second intermediate electrode film 37P and the interlayer insulating film 14 may be patterned so as to extend in the second direction. As a result, the first pre-coating film 23P, the first pre-barrier film 40P and the bit line film BLP may be patterned as the first coating film 23, the first barrier film 40 and the bit lines BL1, BL2, respectively.

Figure 41:
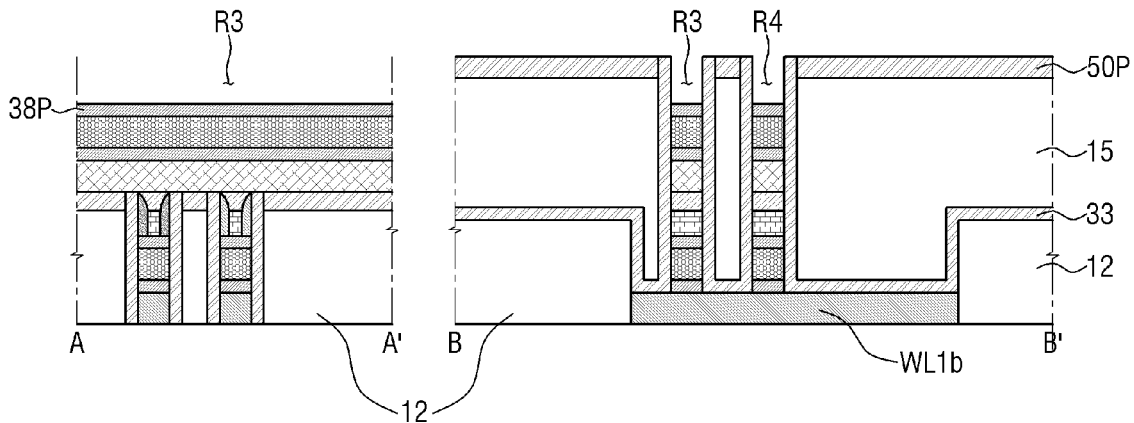

Next, referring to FIG. 41, the second pre-coating film 33P and the second pre-barrier film 50P are formed, and the third recess R3 and the fourth recess R4 are formed.

The third recess R3 and the fourth recess R4 may be formed so as to be overlapped with the bit lines BL1, BL2. The sidewalls of the third recess R3 and the fourth recess R4 may be the second coating film 33. The bottom surfaces of the third recess R3 and the fourth recess R4 may be the second intermediate electrode film 37P.

Figure 42:
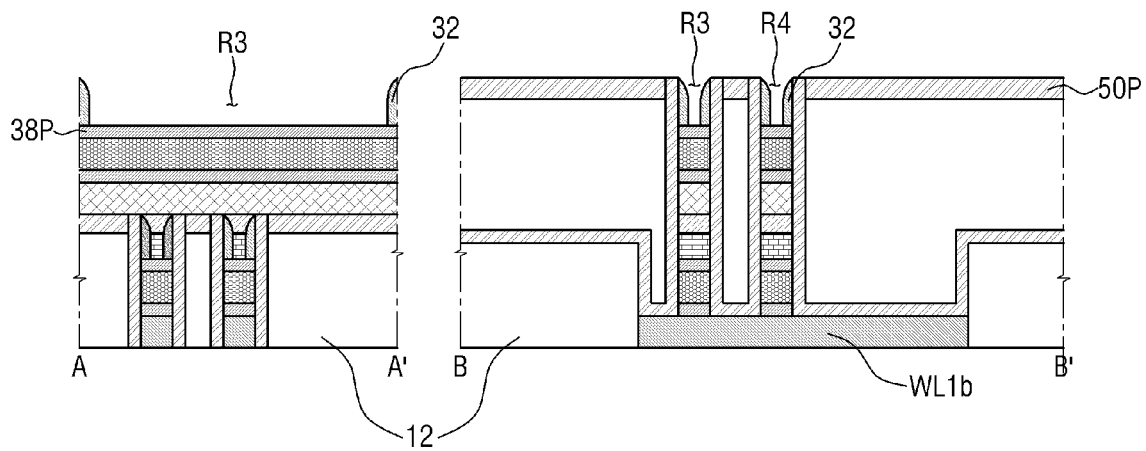

Next, referring to FIG. 42, the second spacer 32 is formed on the sidewall of the third recess R3 and the sidewall of the fourth recess R4.

The sidewall of the third recess R3 and the sidewall of the fourth recess R4 may include all of the first direction X sidewall and the second direction Y sidewall. In the cross sectional view taken on A-A' of FIG. 42, the second spacer 32 formed on the first direction X sidewall can be seen. In the cross sectional view taken on B-B' of FIG. 42, the second spacer 32 formed on the second direction Y sidewall can be seen.

The second spacer 32 may be formed in a manner in which the second spacer film in the liner form is deposited and then a portion of the second spacer film is removed. In this case, as for the manner of removing, the etch-back process may be used, although exemplary embodiments are not limited thereto.

Figure 43:
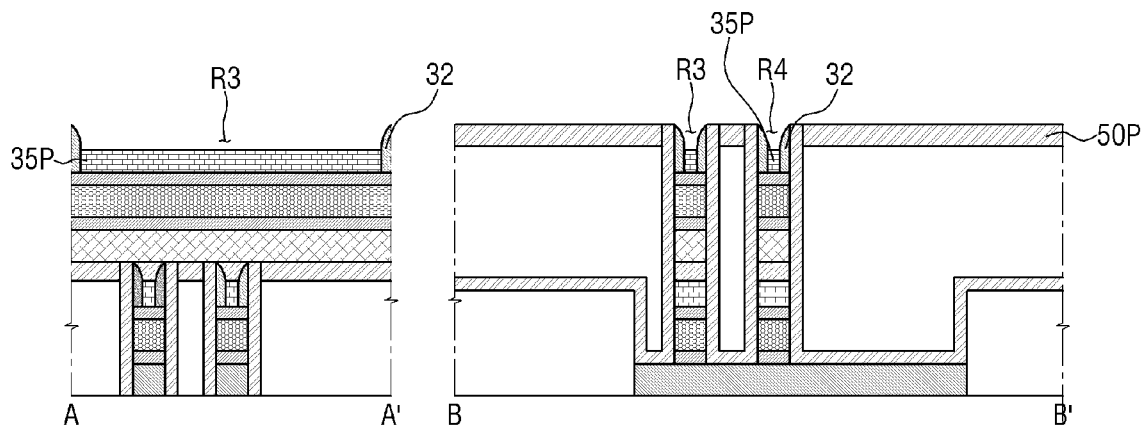

Next, referring to FIG. 43, the second PCM film 35P is formed.

The second PCM film 35P may fill a portion of the third recess R3 and a portion of the fourth recess R4. The second PCM film 35P may be formed on the second intermediate electrode film 37p.

Figure 44:
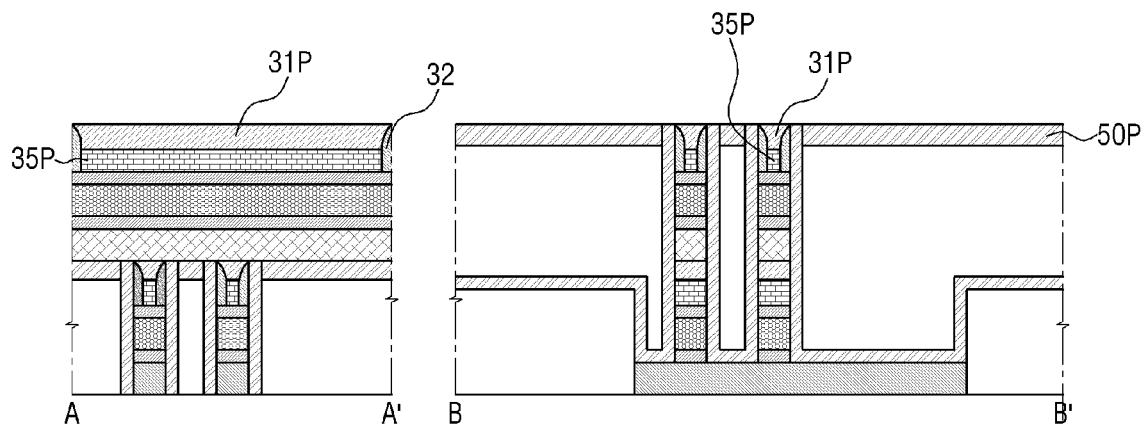

Next, referring to FIG. 44, the second upper electrode film 31P is formed.

The second upper electrode film 31P may entirely fill the third recess R3 and the fourth recess R4. The second upper electrode film 31P may be formed on the second PCM film 35P. The second upper electrode film 31P may be formed so as to entirely fill the third recess R3 and the fourth recess R4 and cover the second pre-barrier film 50P, and may then have the same plane as the second pre-barrier film 50p by the chemical physical polishing.

Figure 45:
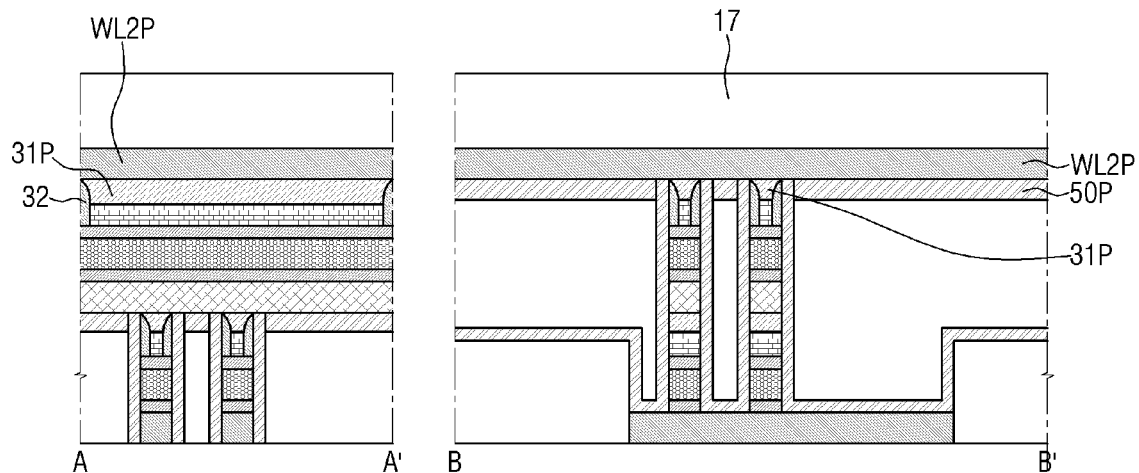

Next, referring to FIG. 45, the second word line film WL2P and the interlayer insulating film 17 are sequentially formed on the second pre-barrier film 50P and the second upper electrode film 31P.

Figure 46:
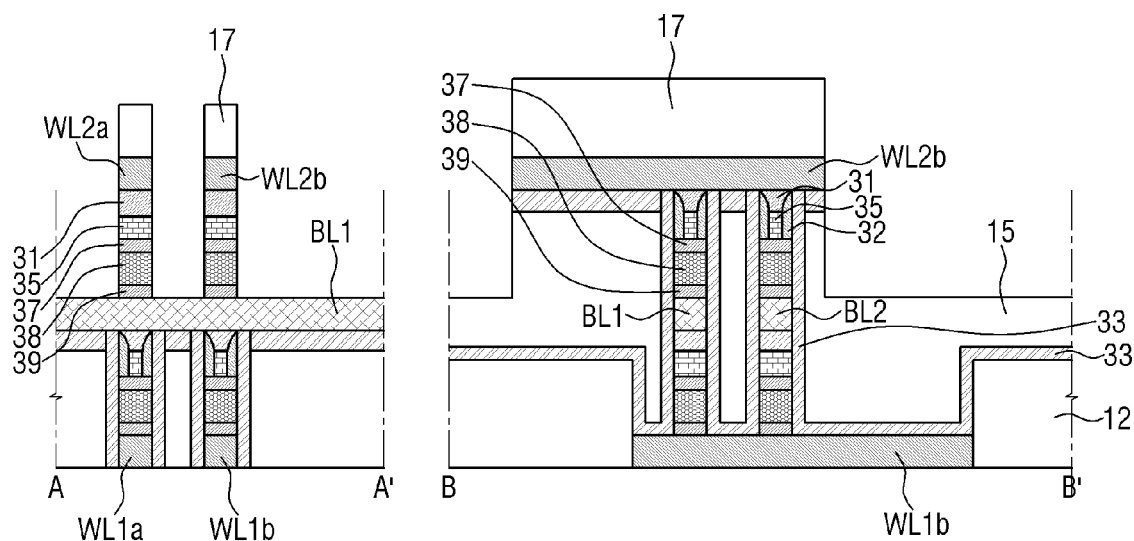

Next, referring to FIG. 46, the interlayer insulating film 15, the second pre-barrier film 50P, the second lower electrode film 39P, the second OTS film 38P, the second intermediate electrode film 37P, the second PCM film 35P, the second upper electrode film 31P, the second word line film WL2P and the interlayer insulating film 17 are patterned.

The second lower electrode film 39P, the second OTS film 38P, the second intermediate electrode film 37P, the second PCM film 35P and the second upper electrode film 31P may be patterned so as to be positioned in the intersect regions CA. Accordingly, the second lower electrode film 39P, the second OTS film 38P, the second intermediate electrode film 37P, the second PCM film 35P and the second upper electrode film 31P may be patterned as the second lower electrode 39, the second OTS 38, the second intermediate electrode 37, the second PCM 35 and the second upper electrode 31, respectively.

The interlayer insulating film 17, the second pre-barrier film 50P, the second word line film WL2P and the interlayer insulating film 15 may be patterned so as to extend in the first direction X. Further, the interlayer insulating film 17, the second pre-barrier film 50P, the second word line film WL2P and the interlayer insulating film 15 may be patterned so as to be overlapped with a portion of the first word lines WL1a, WL1b. As a result, the second pre-barrier film 50P and the second word line film WL2P may be patterned as the second barrier film 50 and the second word lines WL2a, WL2b, respectively.

Figure 47:
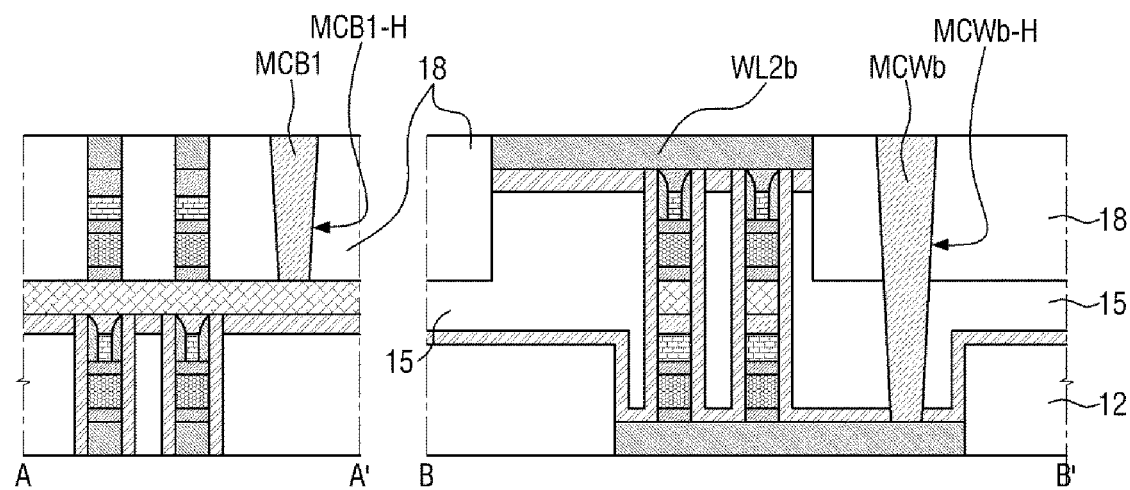

Next, referring to FIG. 47, the contact holes MCWa-H, MCWb-H, MCB1-H, MCB2-H penetrating through the interlayer insulating films 15, 18 and the second coating film 33 are formed.

The contact holes MCWa-H, MCWb-H, MCB1-H, MCB2-H include the first word line contact holes MCWa-H, MCWb-H, and the bit line contact holes MCB1-H, MCB2-H. The first word line contact holes MCWa-H, MCWb-H may expose the upper surfaces of the first word lines WL1a, WL1b. The first word lines WL1a, WL1b include the overlap regions overlapped with the bit lines BL1, BL2 and the second word lines WL2a, WL2b, and the non-overlap regions not overlapped with the bit lines BL1, BL2 or the second word lines WL2a, WL2b. The first word line contact holes MCWa-H, MCWb-H may expose the non-overlap regions.

The first word line contact holes MCWa-H, MCWb-H may be formed by penetrating through the interlayer insulating films 15, 18 and the second coating film 33.

The bit line contact holes MCB1-H, MCB2-H may expose the upper surfaces of the bit lines BL1, BL2. The bit line contact holes MCB1-H, MCB2-H may also expose the first word lines WL1a, WL1b and regions not overlapped with the second word lines WL2a, WL2b.

The bit line contact holes MCB1-H, MCB2-H may be formed by penetrating through the interlayer insulating film 18.

The contacts MCWa, MCWb, MCB1, MCB2 include the first word line contacts MCWa, MCWb and the bit line contacts MCB1, MCB2. The first word line contacts MCWa, MCWb fill the first word line contact holes MCWa-H, MCWb-H, and the bit line contacts MCB1, MCB2 fill the bit line contact holes MCB1-H, MCB2-H. For example, the contacts include at least one of W or TiN. However, exemplary embodiments are not limited to the example given above.

Figure 48:
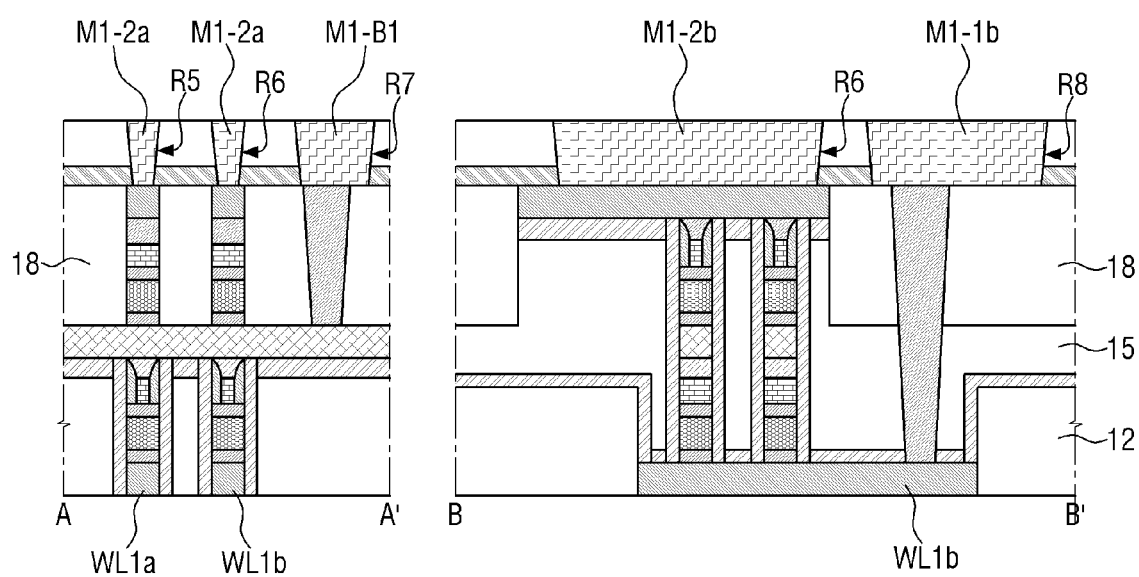

Next, referring to FIG. 48, the fifth recess R5, the sixth recess R6, the seventh recess R7 and the eighth recess R8 are formed by patterning the nitride film 60 and the interlayer insulating film 19. The fifth recess R5 and the sixth recess R6 may expose the upper surfaces of the second word lines WL2a, WL2b. The seventh recess R7 may expose the upper surface of the bit line contacts MCB1, MCB2, and the eighth recess R8 may expose the upper surfaces of the first word line contacts MCWa, MCWb.

Next, the wire patterns M1-1a, M1-2a, M1-1b, M1-2b, M1-B1, M1-B2 are formed.

Among the wire patterns M1-1a, M1-2a, M1-1b, M1-2b, M1-B1, M1-B2, the first wires M1-1a, M1-1b may fill the eighth recess R8 to connect with the first word line contacts MCWa, MCWb. Among the wire patterns M1-1a, M1-2a, M1-1b, M1-2b, M1-B1, M1-B2, the second wires M1-B1, M1-B2 may fill the seventh recess R7 to connect with the bit line contacts MCB1, MCB2. Among the wire patterns M1-1a, M1-2a, M1-1b, M1-2b, M1-B1, M1-B2, the third wires M1-2a, M1-2b may fill the fifth recess R5 and the sixth recess R6 to connect with the first word line contacts MCWa, MCWb.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A semiconductor device comprising:
   a first word line and a second word line extending abreast of each other in a first direction;
   a bit line extending between the first word line and the second word line in a second direction intersecting the first direction;
   a first lower electrode formed on one surface of the first word line;
   a first ovonic threshold switch (OTS) formed on the first lower electrode;
   a first intermediate electrode formed on the first OTS;
   a first phase change memory (PCM) formed on the first intermediate electrode;
   a first upper electrode formed between the first PCM and a surface of the bit line, wherein:
   a first area of contact between the first PCM and the first upper electrode is smaller than a second area of contact between the first PCM and the first intermediate electrode, a width of the first upper electrode in the second direction is narrower than a width of the first intermediate electrode in the second direction, and a cross-sectional area of the first upper electrode decreases along its length from where the first upper electrode contacts the bit line to where the first upper electrode contacts the first PCM;

a second lower electrode formed on another surface of the bit line;

a second OTS formed on the second lower electrode;

a second intermediate electrode formed on the second OTS;

a second PCM formed on the second intermediate electrode;

a second upper electrode formed between the second PCM and the second word line; and an interlayer insulating film surrounding the first word line, wherein a first height of a first portion of the interlayer insulating film extending along the first direction differs from a second height of the interlayer insulating film extending along the second direction, wherein:

the first word line and the second word line are spaced apart in a third direction that is orthogonal to the first direction and the second direction, the first word line comprises a first overlap region overlapped with a portion of the second word line in the third direction and a first non-overlap region not overlapped with the second word line in the third direction, and a width of the second upper electrode in the first direction is narrower than a width of the second intermediate electrode in the first direction.

2. The semiconductor device of claim 1, wherein the first lower electrode, the first OTS, the first intermediate electrode, the first PCM and the first upper electrode are formed in a first intersect region where the first word line and the bit line are overlapped.

3. The semiconductor device of claim 2, wherein the second lower electrode, the second OTS, the second intermediate electrode, the second PCM and the second upper electrode are formed in a second intersect region where the second word line and the bit line are overlapped.

4. The semiconductor device of claim 1, wherein the bit line is spaced apart from the first word line and the second word line in the third direction.

5. The semiconductor device of claim 1, wherein a width of the second PCM in the first direction is narrower than the width of the second intermediate electrode in the first direction.

6. The semiconductor device of claim 1, further comprising a first spacer formed on a side surface of the first upper electrode.

7. The semiconductor device of claim 6, further comprising a second spacer formed on a side surface of the second upper electrode.

8. The semiconductor device of claim 6, wherein the first spacer extends to a side surface of the first PCM.

9. A semiconductor device comprising:
a bit line;
a first cell formed under the bit line, and comprising a first ovonic threshold switch (OTS), a first phase change memory (PCM), a first intermediate electrode formed between the first OTS and the first PCM, and a first upper electrode formed between the first PCM and the bit line, wherein:

a first area of contact between the first PCM and the first upper electrode is smaller than a second area of contact between the first PCM and the first intermediate electrode, and a first cross-sectional area of the first upper electrode decreases along its length from where the first upper electrode contacts the bit line to where the first upper electrode contacts the first PCM;

a second cell formed on the bit line, and comprising a second OTS, a second PCM, a second intermediate electrode formed between the second OTS and the second PCM, and a second upper electrode formed on the second PCM, wherein a third area of contact between the second PCM and the second upper electrode is smaller than a fourth area of contact between the second PCM and the second intermediate electrode;

a first word line and a second word line extending in a first direction; and an interlayer insulating film surrounding the first cell, wherein a first height of a first portion of the interlayer insulating film extending along the first direction differs from a second height of the interlayer insulating film extending along a second direction intersecting the first direction, wherein:

the bit line extends in the second direction, the first word line and the second word line are spaced apart in a third direction that is orthogonal to the first direction and the second direction and disposed on opposite sides of the bit line, the first word line and the second word line are spaced apart in a third direction that is orthogonal to the first direction and the second direction, and the first word line comprises a first overlap region overlapped with a portion of the second word line in the third direction and a first non-overlap region not overlapped with the second word line in the third direction.

10. The semiconductor device of claim 9, wherein the first cell is formed in a region where the bit line and the second word line are overlapped.

11. The semiconductor device of claim 9, wherein the first cell comprises a first spacer surrounding the first upper electrode on a side surface.

12. The semiconductor device of claim 11, wherein the second cell comprises a second spacer surrounding the second upper electrode on a side surface.

13. The semiconductor device of claim 12, wherein directions in which the first spacer and the second spacer extend are different from each other.

14. The semiconductor device of claim 12, wherein the second spacer extends in the second direction.

15. The semiconductor device of claim 9, wherein the first upper electrode comprises:
a first region being in contact with the first PCM and having a first resistance; and
a second region being on the first region and having a second resistance lower than the first resistance.

16. A semiconductor device comprising:
a first word line and a second word line extending in a first direction and being partially overlapped with each other;
a bit line extending between the first word line and the second word line in a second direction intersecting the first direction;
a first cell and a second cell formed in a region where the bit line and the first word line and the second word line are overlapped, the first and second cells respectively connected with opposing surfaces of the bit line; and an interlayer insulating film surrounding the first cell, wherein a first height of a first portion of the interlayer insulating film extending along the first direction differs from a second height of the interlayer insulating film extending along the second direction, wherein:
the first word line and the second word line are spaced apart in a third direction that is orthogonal to the first direction and the second direction,
the first word line comprises a first overlap region overlapped with a portion of the second word line in the third direction and a first non-overlap region not overlapped with the second word line in the third direction,
the first cell comprises a first ovonic threshold switch (OTS), a first phase change memory (PCM), a first intermediate electrode formed between the first OTS and the first PCM, a first upper electrode formed on the first PCM, and a first spacer positioned on a side surface of the first upper electrode,
the second cell comprises a second OTS, a second PCM, a second intermediate electrode formed between the second OTS and the second PCM, a second upper electrode formed on the second PCM, and a second spacer positioned on a side surface of the second upper electrode,
the first spacer extends in the first direction and the second spacer extends in the second direction,
a first area of contact between the first PCM and the first upper electrode is smaller than a second area of contact between the first PCM and the first intermediate electrode, and
a first cross-sectional area of the first upper electrode decreases along its length from where the first upper electrode contacts the bit line to where the first upper electrode contacts the first PCM.

* * * * *